(12) United States Patent
Takahashi et al.

(10) Patent No.: US 11,508,307 B2
(45) Date of Patent: Nov. 22, 2022

(54) METHOD FOR OPERATING DISPLAY DEVICE

(71) Applicant: SEMICONDUCTOR ENERGY LABORATORY CO., LTD., Atsugi (JP)

(72) Inventors: Kei Takahashi, Kanagawa (JP); Koji Kusunoki, Kanagawa (JP); Kouhei Toyotaka, Kanagawa (JP); Susumu Kawashima, Kanagawa (JP); Kazunori Watanabe, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/273,818

(22) PCT Filed: Aug. 30, 2019

(86) PCT No.: PCT/IB2019/057307
§ 371 (c)(1),
(2) Date: Mar. 5, 2021

(87) PCT Pub. No.: WO2020/053693
PCT Pub. Date: Mar. 19, 2020

(65) Prior Publication Data
US 2021/0343243 A1    Nov. 4, 2021

(30) Foreign Application Priority Data

Sep. 12, 2018   (JP) .............................. JP2018-170405

(51) Int. Cl.
*G09G 3/3258*   (2016.01)
*H01L 25/16*    (2006.01)
*H01L 27/32*    (2006.01)

(52) U.S. Cl.
CPC ..... *G09G 3/3258* (2013.01); *G09G 2300/043* (2013.01); *G09G 2300/0842* (2013.01);
(Continued)

(58) Field of Classification Search
CPC ......... G09G 2300/0819; G09G 3/3233; G09G 2300/0852; G09G 2300/0814
See application file for complete search history.

(56) References Cited

U.S. PATENT DOCUMENTS

| | | |
|---|---|---|
| 8,884,852 B2 | 11/2014 | Yamamoto et al. |
| 9,111,491 B2 | 8/2015 | Woo et al. |

(Continued)

FOREIGN PATENT DOCUMENTS

| | | |
|---|---|---|
| CN | 101887689 A | 11/2010 |
| CN | 103886831 A | 6/2014 |

(Continued)

OTHER PUBLICATIONS

Ota Hitoshi JP2009063607 English machine translation Sep. 4, 2007 (Year: 2007).*

(Continued)

*Primary Examiner* — Van N Chow
(74) *Attorney, Agent, or Firm* — Fish & Richardson P.C.

(57) ABSTRACT

A display device that can correct the threshold voltage of a driving transistor without a correction of image data is provided. A display device including a pixel provided with a driving transistor, a display element, and a memory circuit and a correction data generation circuit is related. One of a source and a drain of the driving transistor is electrically connected to one electrode of the display element, and a gate of the driving transistor is electrically connected to the memory circuit. In a first period, the correction data generation circuit generates correction data that is data for correcting the threshold voltage of the driving transistor. In (Continued)

a second period, first data is written to the memory circuit. In a third period, second data is supplied to the pixel, whereby third data in which the second data is added to the first data is generated. In a fourth period, an image corresponding to the third data is displayed by the display element.

13 Claims, 21 Drawing Sheets

(52) U.S. Cl.
CPC .... *G09G 2320/0233* (2013.01); *H01L 25/167* (2013.01); *H01L 27/3244* (2013.01)

(56) References Cited

U.S. PATENT DOCUMENTS

| | | | |
|---|---|---|---|
| 9,230,996 B2 | 1/2016 | Miyake et al. | |
| 9,305,494 B2 | 4/2016 | Shim et al. | |
| 9,430,968 B2 | 8/2016 | Kishi et al. | |
| 10,140,940 B2 | 11/2018 | Aoki | |
| 2007/0212078 A1* | 9/2007 | Jo | G09G 3/2014 398/189 |
| 2010/0289830 A1 | 11/2010 | Yamamoto et al. | |
| 2011/0157133 A1* | 6/2011 | Ogura | G09G 3/3291 345/82 |
| 2014/0176525 A1 | 6/2014 | Woo et al. | |
| 2015/0187276 A1 | 7/2015 | Shim et al. | |
| 2015/0213757 A1* | 7/2015 | Takahama | G09G 3/3291 345/691 |
| 2015/0279324 A1* | 10/2015 | Ohta | G09G 3/3283 345/82 |
| 2016/0055791 A1* | 2/2016 | Kishi | G09G 3/3241 345/212 |
| 2016/0111044 A1 | 4/2016 | Kishi et al. | |
| 2017/0025080 A1 | 1/2017 | Aoki | |
| 2019/0012948 A1* | 1/2019 | Ohara | G09G 3/2003 |
| 2020/0193928 A1 | 6/2020 | Kawashima et al. | |
| 2020/0194527 A1 | 6/2020 | Kawashima et al. | |
| 2020/0320930 A1 | 10/2020 | Toyotaka et al. | |
| 2021/0097951 A1 | 4/2021 | Toyotaka et al. | |
| 2021/0110783 A1 | 4/2021 | Kawashima et al. | |
| 2022/0057777 A1* | 2/2022 | Simsek-Ege | G05B 19/40938 |

FOREIGN PATENT DOCUMENTS

| | | |
|---|---|---|
| CN | 104751781 A | 7/2015 |
| CN | 105247603 A | 1/2016 |
| DE | 102014118997 | 7/2015 |
| EP | 2747066 A | 6/2014 |
| EP | 2889862 A | 7/2015 |
| JP | 2009-063607 A | 3/2009 |
| JP | 2009-265459 A | 11/2009 |
| JP | 2010-266494 A | 11/2010 |
| JP | 2011-112722 A | 6/2011 |
| JP | 2014-123125 A | 7/2014 |
| JP | 2015-129926 A | 7/2015 |
| JP | 2015-129934 A | 7/2015 |
| JP | 2017-027012 A | 2/2017 |
| KR | 2010-0122443 A | 11/2010 |
| KR | 2014-0081450 A | 7/2014 |
| KR | 2015-0077710 A | 7/2015 |
| TW | 201106323 | 2/2011 |
| TW | 201426713 | 7/2014 |
| TW | 201506884 | 2/2015 |
| TW | 201525968 | 7/2015 |
| WO | WO-201 4/208459 | 12/2014 |

OTHER PUBLICATIONS

International Search Report (Application No. PCT/IB2019/057307) dated Dec. 3, 2019.
Written Opinion (Application No. PCT/IB2019/057307) dated Dec. 3, 2019.

* cited by examiner

T01

T11

T14

T21

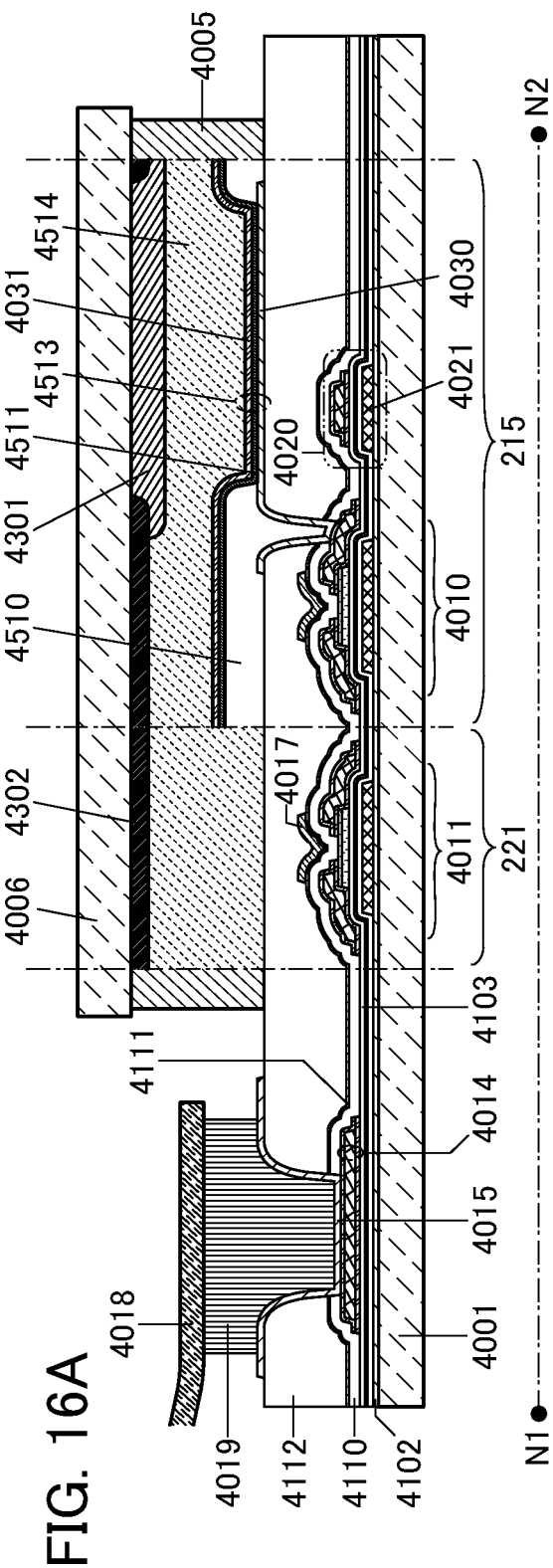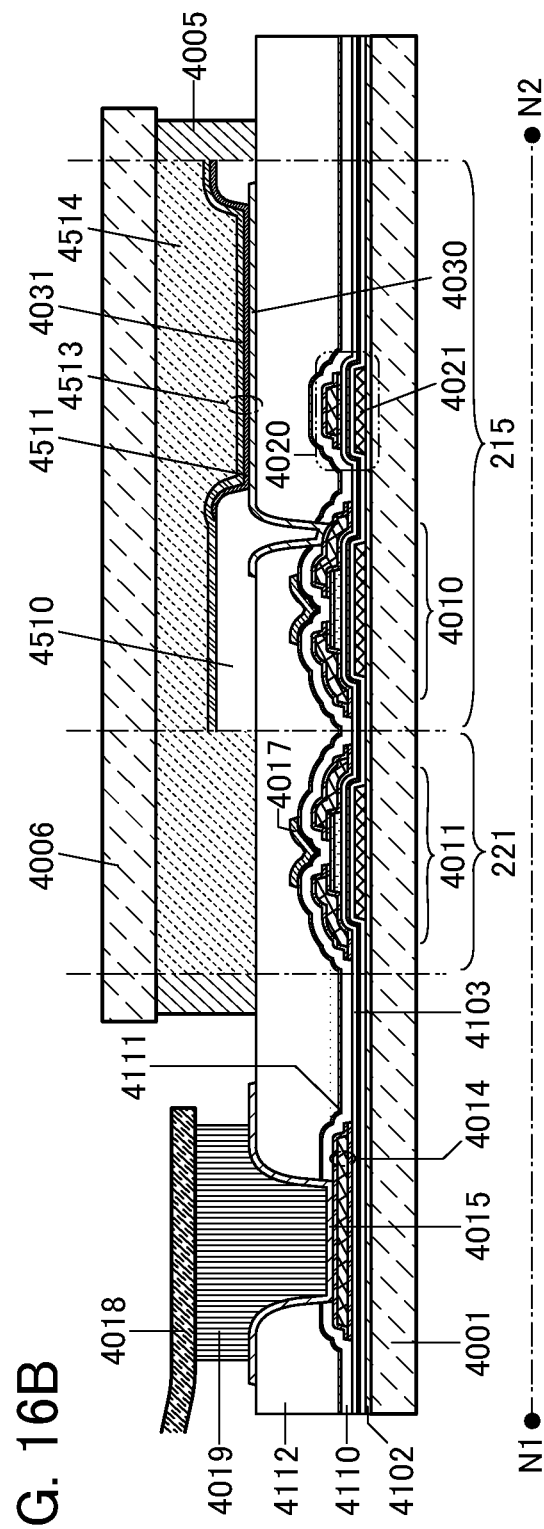

FIG. 19A1
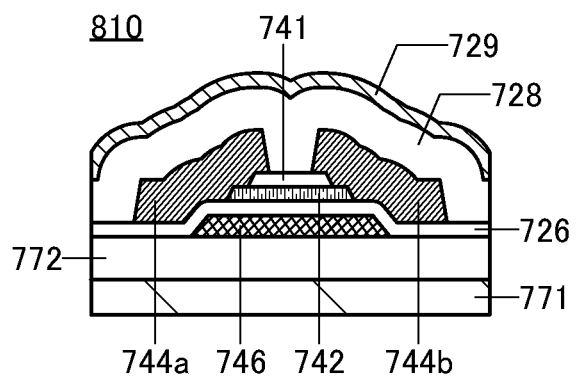
FIG. 19A2
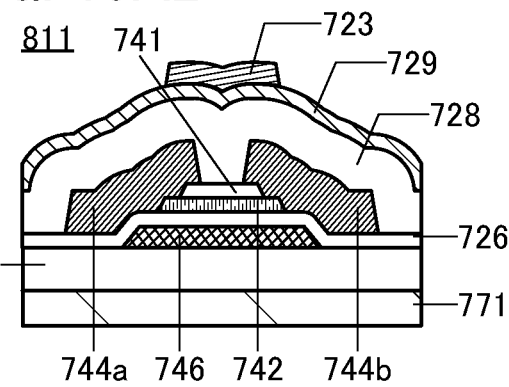
FIG. 19B1
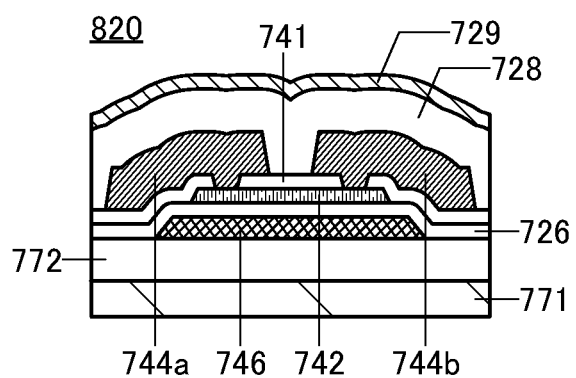
FIG. 19B2
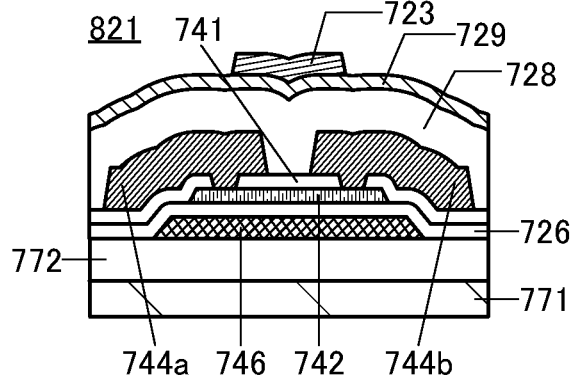
FIG. 19C1
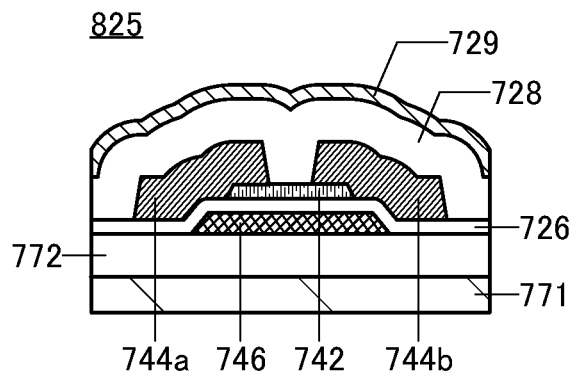
FIG. 19C2
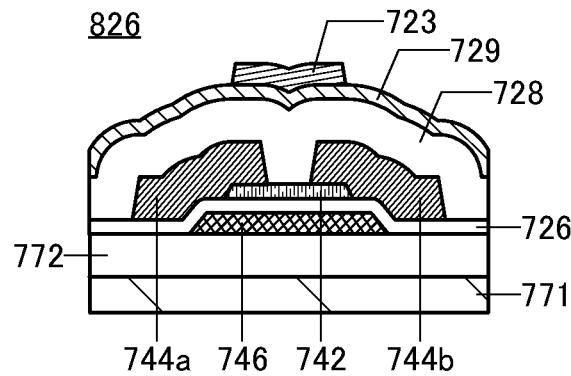

FIG. 20A1
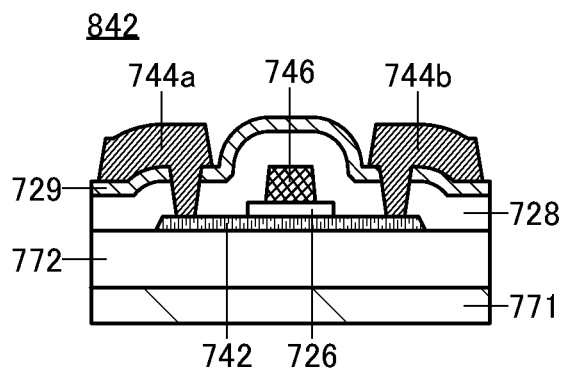
FIG. 20A2
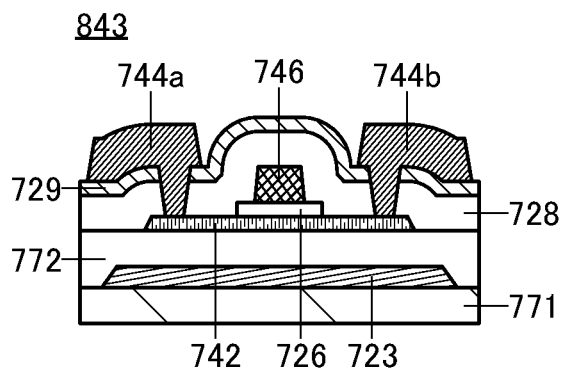
FIG. 20A3
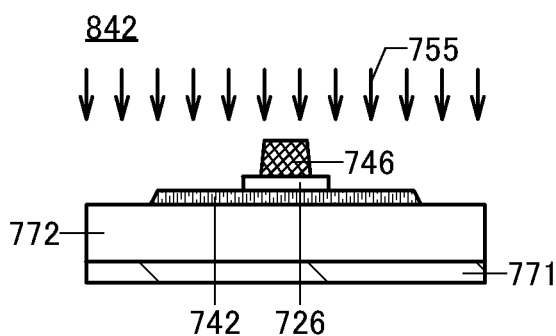
FIG. 20B1
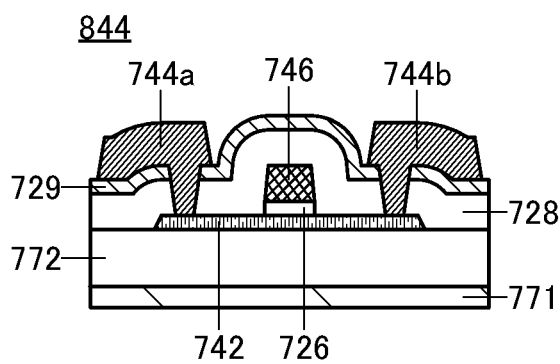
FIG. 20B2
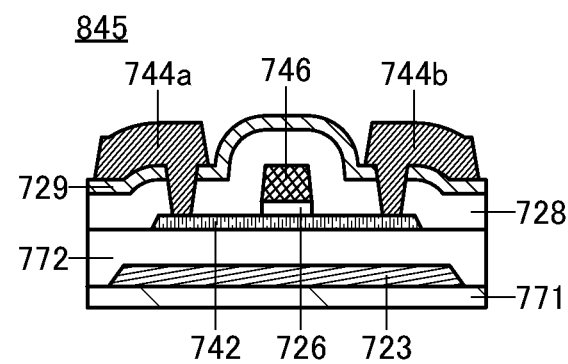
FIG. 20C1
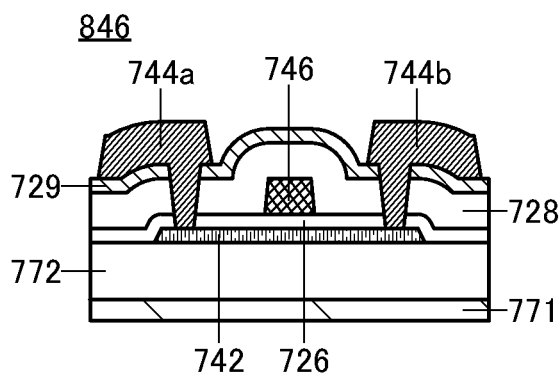
FIG. 20C2
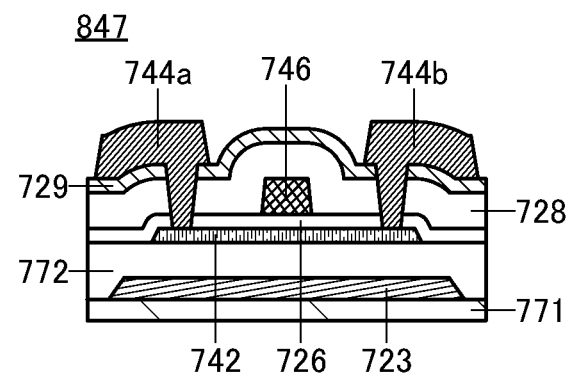

METHOD FOR OPERATING DISPLAY DEVICE

CROSS REFERENCE TO RELATED APPLICATIONS

This application is a U.S. National Phase Application under 35 U.S.C. § 371 of International Application PCT/IB2019/057307, filed on Aug. 30, 2019, which is incorporated by reference and claims the benefit of a foreign priority application filed in Japan on Sep. 12, 2018, as Application No. 2018-170405.

TECHNICAL FIELD

One embodiment of the present invention relates to a display device and an operating method therefor.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof Note that in this specification and the like, a semiconductor device generally means a device that can function by utilizing semiconductor characteristics. A transistor and a semiconductor circuit are embodiments of semiconductor devices. Furthermore, in some cases, a memory device, a display device, an imaging device, or an electronic device includes a semiconductor device.

BACKGROUND ART

In a display device using a light-emitting element as a display element, the luminance of light emitted from the display element is likely to reflect a variation in the threshold voltage of a driving transistor, which controls a current supplied to the display element in accordance with image data. Patent Document 1 describes a display device in which, from a source potential of a driving transistor, the threshold voltage and mobility of the driving transistor are determined and image data is corrected on the basis of the determined threshold voltage and mobility. This can correct the threshold voltage of the driving transistor. Therefore, the influence of a pixel-to-pixel variation in the threshold voltage of the driving transistor on the luminance of light emitted from a display element can be small.

REFERENCE

Patent Document

[Patent Document 1] Japanese Published Patent Application No. 2009-265459

SUMMARY OF THE INVENTION

Problems to be Solved by the Invention

In order to correct the threshold voltage of a driving transistor by correcting image data, a dynamic range (a difference between the maximum value and the minimum value of a potential that a signal corresponding to image data can have) of the image data needs to be increased. This increases the increase amount of the potential of a signal corresponding to image data at the time when the luminance of light emitted from a display element is increased by one gray level, for example; therefore, the quality of a displayed image might be reduced. Furthermore, a data driver circuit provided in a display device needs to have high withstand voltage, which increases the fabrication cost of the display device in some cases. Moreover, the power consumption of the display device might be increased owing to an increase in the output potential of the data driver circuit.

One object of one embodiment of the present invention is to provide a display device that can correct the threshold voltage of a driving transistor without a correction of image data. Another object is to provide a display device that can display a high-quality image. Another object is to provide an inexpensive display device. Another object is to provide a display device with low power consumption. Another object is to provide a display device that can display a high-luminance image. Another object is to provide a small display device. Another object is to provide a display device with a large-area display portion. Another object is to provide a highly reliable display device. Another object is to provide a novel display device. Another object is to provide a novel semiconductor device or the like.

Another object is to provide a method for operating a display device that can correct the threshold voltage of a driving transistor without a correction of image data. Another object is to provide a method for operating a display device that can display a high-quality image. Another object is to provide a method for operating an inexpensive display device. Another object is to provide a method for operating a display device with low power consumption. Another object is to provide a method for operating a display device that can display a high-luminance image. Another object is to provide a method for operating a small display device. Another object is to provide a method for operating a display device with a large-area display portion. Another object is to provide a method for operating a highly reliable display device. Another object is to provide a method for operating a novel display device. Another object is to provide a method for operating a novel semiconductor device or the like.

Note that the descriptions of these objects do not preclude the existence of other objects. One embodiment of the present invention does not need to achieve all these objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a method for operating a display device including a pixel provided with a transistor, a display element, and a memory circuit and a correction data generation circuit, in which one of a source and a drain of the transistor is electrically connected to one electrode of the display element, and a gate of the transistor is electrically connected to the memory circuit. In the method, the correction data generation circuit generates correction data, which is data for correcting a threshold voltage of the transistor, in a first period; first data is written to the memory circuit in a second period; second data is supplied to the pixel in a third period to generate third data, which is data in which the second data is added to the first data; and an image corresponding to the third data is displayed by the display element in a fourth period.

Alternatively, in the above embodiment, in the first period, a potential corresponding to the correction data may be supplied to a back gate of the transistor after the correction data generation circuit generates the correction data.

Alternatively, in the above embodiment, in the first period, current may be fed to the transistor and the correction data generation circuit may generate the correction data corresponding to the current.

Alternatively, in the above embodiment, the correction data generation circuit may generate the correction data such that the current flowing through the transistor is lower than or equal to a certain value in the first period.

Alternatively, in the above embodiment, no current may be fed to the display element in the first period, and current may be fed to the display element in the fourth period.

Alternatively, one embodiment of the present invention is a method for operating a display device including a pixel provided with a first transistor, a second transistor, a third transistor, a capacitor, and a display element and a correction data generation circuit, in which one of a source and a drain of the first transistor is electrically connected to one electrode of the capacitor, one of a source and a drain of the second transistor is electrically connected to the other electrode of the capacitor, the other electrode of the capacitor is electrically connected to a gate of the third transistor, and one of a source and a drain of the third transistor is electrically connected to one electrode of the display element. In the method, the correction data generation circuit generates correction data, which is data for correcting a threshold voltage of the third transistor, in a first period; a first potential is supplied to the other electrode of the capacitor in a second period; a second potential is supplied to the one electrode of the capacitor in a third period so that a potential of the other electrode of the capacitor becomes a third potential; and current corresponding to the third potential is allowed to flow through the display element in a fourth period.

Alternatively, in the above embodiment, in the first period, a potential corresponding to the correction data may be supplied to a back gate of the third transistor after the correction data generation circuit generates the correction data.

Alternatively, in the above embodiment of the method for operating the display device, the pixel includes a fourth transistor, and one of a source and a drain of the fourth transistor is electrically connected to the one of the source and the drain of the third transistor. In the first period, the fourth transistor may be turned on to allow current to flow through the third and fourth transistors and the correction data generation circuit may generate the correction data corresponding to the current.

Alternatively, in the above embodiment, the correction data generation circuit may generate the correction data such that the current flowing through the third transistor is lower than or equal to a certain value in the first period.

Alternatively, in the above embodiment, the fourth transistor may be turned off in the fourth period.

Alternatively, in the above embodiment, the second transistor may include a metal oxide in a channel formation region, and the metal oxide may include In, Zn, and M(M is Al, Ti, Ga, Ge, Sn, Y, Zr, La, Ce, Nd, or Hf).

Alternatively, in the above embodiment, the display element may be an organic EL element.

Effect of the Invention

With one embodiment of the present invention, a display device that can correct the threshold voltage of a driving transistor without a correction of image data can be provided. Alternatively, a display device that can display a high-quality image can be provided. Alternatively, an inexpensive display device can be provided. Alternatively, a display device with low power consumption can be provided. Alternatively, a display device that can display a high-luminance image can be provided. Alternatively, a small display device can be provided. Alternatively, a display device with a large-area display portion can be provided. Alternatively, a highly reliable display device can be provided. Alternatively, a novel display device can be provided. Alternatively, a novel semiconductor device or the like can be provided.

Alternatively, a method for operating a display device that can correct the threshold voltage of a driving transistor without a correction of image data can be provided. Alternatively, a method for operating a display device that can display a high-quality image can be provided. Alternatively, a method for operating an inexpensive display device can be provided. Alternatively, a method for operating a display device with low power consumption can be provided. Alternatively, a method for operating a display device that can display a high-luminance image can be provided. Alternatively, a method for operating a small display device can be provided. Alternatively, a method for operating a display device with a large-area display portion can be provided. Alternatively, a method for operating a highly reliable display device can be provided. Alternatively, a method for operating a novel display device can be provided. Alternatively, a method for operating a novel semiconductor device or the like can be provided.

Note that the descriptions of these effects do not preclude the existence of other effects. One embodiment of the present invention does not need to have all these effects. Effects other than these can be derived from the descriptions of the specification, the drawings, and the claims.

BRIEF DESCRIPTION OF THE DRAWINGS

FIG. 16A and FIG. 16B are diagrams illustrating structure examples of a display device.

FIG. 19A1, FIG. 19A2, FIG. 19B1, FIG. 19B2, FIG. 19C1, and FIG. 19C2 are diagrams illustrating structure examples of transistors.

FIG. 20A1, FIG. 20A2, FIG. 20A3, FIG. 20B1, FIG. 20B2, FIG. 20C1, and FIG. 20C2 are diagrams illustrating structure examples of transistors.

MODE FOR CARRYING OUT THE INVENTION

Figure 1:
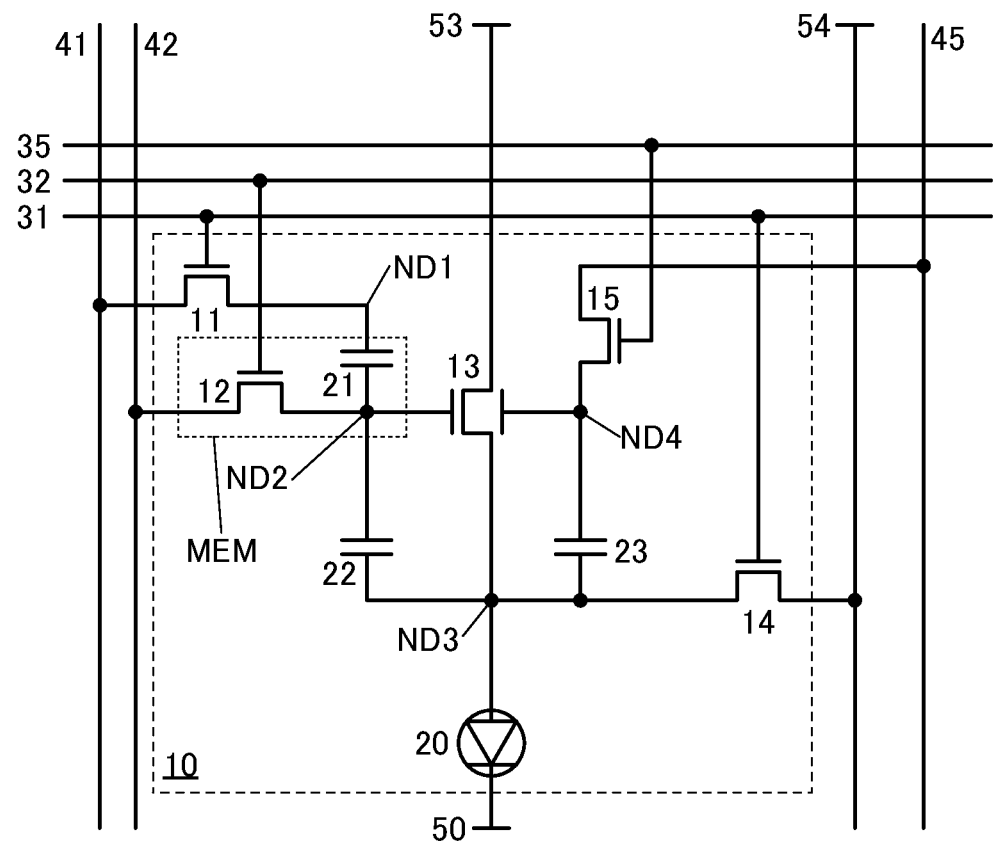
FIG. 1 is a circuit diagram illustrating a configuration example of a pixel.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET can also be called a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

Embodiment 1

In this embodiment, a display device of one embodiment of the present invention and an operation method thereof will be described with reference to drawings.

One embodiment of the present invention is a method for operating a display device that can correct the threshold voltage of a driving transistor without a correction of image data that is supplied to a pixel. With one embodiment of the present invention, the threshold voltage of a driving transistor can be corrected without increasing a dynamic range (a difference between the maximum value and the minimum value of a potential that a signal corresponding to image data can have) of image data. Therefore, the increase in the increase amount of the potential of a signal corresponding to image data at the time when the luminance of light emitted from a display element is increased by one gray level, which is due to a correction of the threshold voltage of the driving transistor, can be inhibited, for example. Thus, the luminance of light emitted from a display element can be accurately controlled, whereby the display device can display a high-quality image. In addition, a data driver circuit provided in the display device does not need to have high withstand voltage, and the display device can be inexpensive. Furthermore, the power consumption of the display device can be reduced because the output potential of the data driver circuit can be inhibited from being increased.

In addition, a memory circuit is provided in a pixel included in the display device of one embodiment of the present invention. Image correction data for correcting image data can be written to the memory circuit, for example. In this manner, image processing such as noise removal can be performed inside a pixel. Therefore, arithmetic processing can be simplified compared with the case where image processing or the like is performed by a direct correction of image data using an arithmetic circuit or the like provided outside the pixel. Accordingly, the power consumption of the display device can be reduced.

In addition, image data can be written to the above memory circuit. After first image data is written to the memory circuit, second image data is supplied to a pixel where the memory circuit is provided, whereby the display device can display an image in which an image corresponding to the first image data and an image corresponding to the second image data are superimposed. The luminance of the superimposed image can be a sum of the luminance of the first image data and the luminance of the second image data. Thus, the display device can display an image corresponding to image data represented by a signal having a higher potential than a potential that can be generated by a data driver circuit. Accordingly, the display device can display a high-luminance image compared with the case of displaying an image corresponding to only one image data, not a superimposed image data. In addition, a data driver circuit does not need to have high withstand voltage, and thus the display device can be inexpensive. Furthermore, the power consumption of the display device can be reduced because the output potential of the data driver circuit can be inhibited from being increased.

<Structure Example 1 of pixel>

FIG. 1 is a diagram illustrating a configuration example of a pixel 10 that is a pixel capable of being used for the display device of one embodiment of the present invention. The pixel 10 includes a transistor 11, a transistor 12, a transistor 13, a transistor 14, a transistor 15, a display element 20, a capacitor 21, a capacitor 22, and a capacitor 23. Here, the transistor 13 includes a back gate in addition to a gate.

One of a source and a drain of the transistor 11 is electrically connected to one electrode of the capacitor 21. One of a source and a drain of the transistor 12 is electrically connected to the gate of the transistor 13. The gate of the transistor 13 is electrically connected to the other electrode of the capacitor 21. The other electrode of the capacitor 21 is electrically connected to one electrode of the capacitor 22.

One of a source and a drain of the transistor 13 is electrically connected to one of a source and a drain of the transistor 14. The one of the source and the drain of the transistor 14 is electrically connected to one electrode of the display element 20. The one electrode of the display element 20 is electrically connected to the other electrode of the capacitor 22. The other electrode of the capacitor 22 is electrically connected to one electrode of the capacitor 23.

The back gate of the transistor 13 is electrically connected to one of a source and a drain of the transistor 15. The one of the source and the drain of the transistor 15 is electrically connected to the other electrode of the capacitor 23.

Here, a node to which the one of the source and the drain of the transistor 11 and the one electrode of the capacitor 21 are electrically connected is referred to as a node ND1. In addition, a node to which the one of the source and the drain of the transistor 12, the gate of the transistor 13, the other electrode of the capacitor 21, and the one electrode of the capacitor 22 are electrically connected is referred to as a node ND2. Furthermore, a node to which the one of the source and the drain of the transistor 13, the one of the source and the drain of the transistor 14, the one electrode of the display element 20, the other electrode of the capacitor 22, and the one electrode of the capacitor 23 are electrically connected is referred to as a node ND3. Moreover, a node to which the back gate of the transistor 13, the one of the source and the drain of the transistor 15, and the other electrode of the capacitor 23 are electrically connected is referred to as a node ND4.

A gate of the transistor 11 and a gate of the transistor 14 are electrically connected to a wiring 31. A gate of the transistor 12 is electrically connected to a wiring 32. A gate of the transistor 15 is electrically connected to a wiring 35. The other of the source and the drain of the transistor 11 is electrically connected to a wiring 41. The other of the source and the drain of the transistor 12 is electrically connected to a wiring 42. The other of the source and the drain of the transistor 15 is electrically connected to a wiring 45. The other of the source and the drain of the transistor 13 is electrically connected to a wiring 53. The other of the source and the drain of the transistor 14 is electrically connected to a wiring 54. The other electrode of the display element 20 is electrically connected to a wiring 50.

The wiring 31, the wiring 32, and the wiring 35 have a function of scan lines. The on/off of the transistor 11 and the transistor 14 can be controlled by a signal that is supplied to the gate of the transistor 11 and the gate of the transistor 14 through the wiring 31. The on/off of the transistor 12 can be controlled by a signal that is supplied to the gate of the transistor 12 through the wiring 32. The on/off of the transistor 15 can be controlled by a signal that is supplied to the gate of the transistor 15 through the wiring 35.

The wiring 41, the wiring 42, and the wiring 45 have a function of data lines. Desired data is supplied to the pixel 10 through the wiring 41, the wiring 42, and the wiring 45.

The wiring 50, the wiring 53, and the wiring 54 have a function of power supply lines. A low potential can be supplied to the wiring 50 and the wiring 54 as a power supply potential, for example. A high potential can be supplied to the wiring 53 as a power supply potential, for example.

The transistor 12 and the capacitor 21 form a memory circuit MEM. Data that is supplied to the pixel 10 through the wiring 42 is written to the node ND2 that is provided in the memory circuit MEM when the transistor 12 is turned on. The data written to the node ND2 is retained when the transistor 12 is turned off. Note that the memory circuit MEM may include an element other than the transistor 12 and the capacitor 21.

In addition, data that is supplied to the pixel 10 through the wiring 45 is written to the node ND4 when the transistor 15 is turned on. The data written to the node ND4 is retained when the transistor 15 is turned off. The data that is written to the node ND4 can be data for correcting the threshold voltage of the transistor 13.

In this specification and the like, data for correcting the threshold voltage of a transistor is referred to as threshold voltage correction data or simply correction data.

Data that is supplied to the pixel 10 through the wiring 41 is written to the node ND1 when the transistor 11 is turned on. The data that is written to the node ND1 can be image data, and an image corresponding to the image data is displayed by the display element 20.

Here, in the case where data is written to the node ND1 and thus the potential of the node ND1 is changed, the potential of the node ND2 is changed by capacitive coupling. Thus, the potential of the node ND2 is a potential dependent on the potential of the node ND1. For example, after data for correcting image data is written to the node ND2, image data is written to the node ND1, whereby the potential of the node ND2 becomes a potential corresponding to the corrected image data. In this manner, image processing such as noise removal can be performed inside the pixel 10. Therefore, arithmetic processing can be simplified compared with the case where image processing or the like is performed by a direct correction of image data using an arithmetic circuit or the like provided outside the pixel 10. Accordingly, the power consumption of the display device of one embodiment of the present invention can be reduced.

In this specification and the like, data for correcting image data is referred to as image correction data.

In addition, image data may be written to the node ND2. For example, after first image data is written to the node ND2, second image data is written to the node ND1, whereby an image in which an image corresponding to the first image data and an image corresponding to the second image data are superimposed is displayed by the display element 20. The luminance of the superimposed image can be a sum of the luminance of the first image data and the luminance of the second image data. Thus, a high-luminance image can be displayed compared with the case of displaying an image corresponding to only one image data, not a superimposed image data.

Note that data that is written to the node ND2 or the like sometimes attenuates because of an element on a transmission path; accordingly, the data that is written to the node ND2 or the like is preferably generated in consideration of the attenuation.

The transistor 13 has a function of a driving transistor that controls a current flowing through the display element 20 in accordance with the potential of the gate of the transistor 13, i.e., the potential of the node ND2. That is, the transistor 13 has a function of setting the value of the current flowing through the display element 20 at the time when the display element 20 displays an image to a value corresponding to image data or the like supplied to the pixel 10.

When a transistor with an extremely low off-state current is used as the transistor 12, the potential of the node ND2 can be retained for a long period; therefore, the pixel 10 can retain the data written to the node ND2 for a long time. When a transistor with an extremely low off-state current is used as the transistor 15, the potential of the node ND4 can be retained for a long period; therefore, the pixel 10 can retain the data written to the node ND4 for a long time. As the transistor with an extremely low off-state current, a transistor using a metal oxide in its channel formation region (hereinafter, an OS transistor) can be used, for example.

Note that an OS transistor may be used not only as the transistor 12 and the transistor 15 but also as other transistors forming the pixel 10. A transistor containing silicon in its channel formation region (hereinafter, a Si transistor) may be used as the transistor 12 and the transistor 15. In addition, some of the transistors 11 to 15 may be OS transistors and the other may be Si transistors. Examples of the Si transistor include a transistor containing amorphous silicon, a transistor containing crystalline silicon (typically, low-temperature polysilicon), and a transistor containing single crystal silicon.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium and the like, and a CAAC-OS (C-Axis Aligned Crystalline Oxide Semiconductor), a CAC-OS (Cloud-Aligned Composite Oxide Semiconductor), each of which will be described later, or the like can be used, for example. A CAAC-OS has a crystal structure including stable atoms and is suitable for a transistor that is required to have high reliability, and the like. The CAC-OS exhibits excellent mobility characteristics and thus is suitable for a transistor that operates at high speed, for example.

An OS transistor has a large energy gap and thus has an extremely low off-state current. Features of an OS transistor are such that impact ionization, an avalanche breakdown, a short-channel effect, and the like do not occur, which are different from those of a Si transistor, leading to formation of a highly reliable circuit.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor forming the semiconductor layer is an In-M-Zn-based oxide, it is preferable that the atomic ratio of metal elements of a sputtering target used to deposit the In-M-Zn-based oxide satisfy In≥M and Zn≥M The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the deposited semiconductor layer may vary from the above atomic ratio of metal elements in the sputtering target in a range of ±40%.

An oxide semiconductor with a low carrier density is used for the semiconductor layer. For example, the semiconductor layer can use an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{16}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low density of defect states and thus can be regarded as an oxide semiconductor having stable characteristics.

Note that without limitation to the above, a material having appropriate composition may be used in accordance with required semiconductor characteristics and electrical characteristics (field-effect mobility, threshold voltage, or the like) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor forming the semiconductor layer, oxygen vacancies are increased, and the semiconductor layer becomes n-type. Thus, the concentration of silicon or carbon (concentration obtained by secondary ion mass spectrometry) in the semiconductor layer is set to lower than or equal to $2\times10^{18}$ atoms/$cm^3$, preferably lower than or equal to $2\times10^{17}$ atoms/$cm^3$.

In addition, alkali metal and alkaline earth metal might generate carriers when bonded to an oxide semiconductor, in which case the off-state current of the transistor might be increased. Thus, the concentration of alkali metal or alkaline earth metal (concentration obtained by secondary ion mass spectrometry) in the semiconductor layer is set to lower than or equal to $1\times10^{18}$ atoms/$cm^3$, preferably lower than or equal to $2\times10^{16}$ atoms/$cm^3$.

When nitrogen is contained in the oxide semiconductor forming the semiconductor layer, electrons serving as carriers are generated and the carrier density increases, so that the semiconductor layer easily becomes n-type. As a result, a transistor using an oxide semiconductor that contains nitrogen is likely to have normally on characteristics. Hence, the concentration of nitrogen (concentration obtained by secondary ion mass spectrometry) in the semiconductor layer is preferably set to lower than or equal to $5\times10^{18}$ atoms/$cm^3$.

The semiconductor layer may have a non-single-crystal structure, for example. The non-single-crystal structure includes, for example, a CAAC-OS including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a stacked-layer structure including two or more of the above regions in some cases.

As the display element 20, a light-emitting element can be used, for example. For example, as the light-emitting element, an organic EL (Electro Luminescence) element, an inorganic EL element, or a QDLED (Quantum Dot Light Emitting Diode) can be used. Alternatively, an LED such as a micro LED can be used as the light-emitting element.

When a micro LED is used as the display element 20, the power consumption of the display device of one embodiment of the present invention can be reduced. In addition, the display device of one embodiment of the present invention can be thinner and more lightweight. Moreover, the display device using the micro LED as the display element 20 has high contrast and a wide viewing angle; thus, a high-quality image can be displayed. Note that in the case where the micro LED is used as the display element 20, the area of a light-emitting region is preferably less than or equal to 10000 $\mu m^2$, further preferably less than or equal to 1000 $\mu m^2$, still further preferably less than or equal to 700 $\mu m^2$.

<Example 1 of Method for Operating Pixel>

Figure 2:
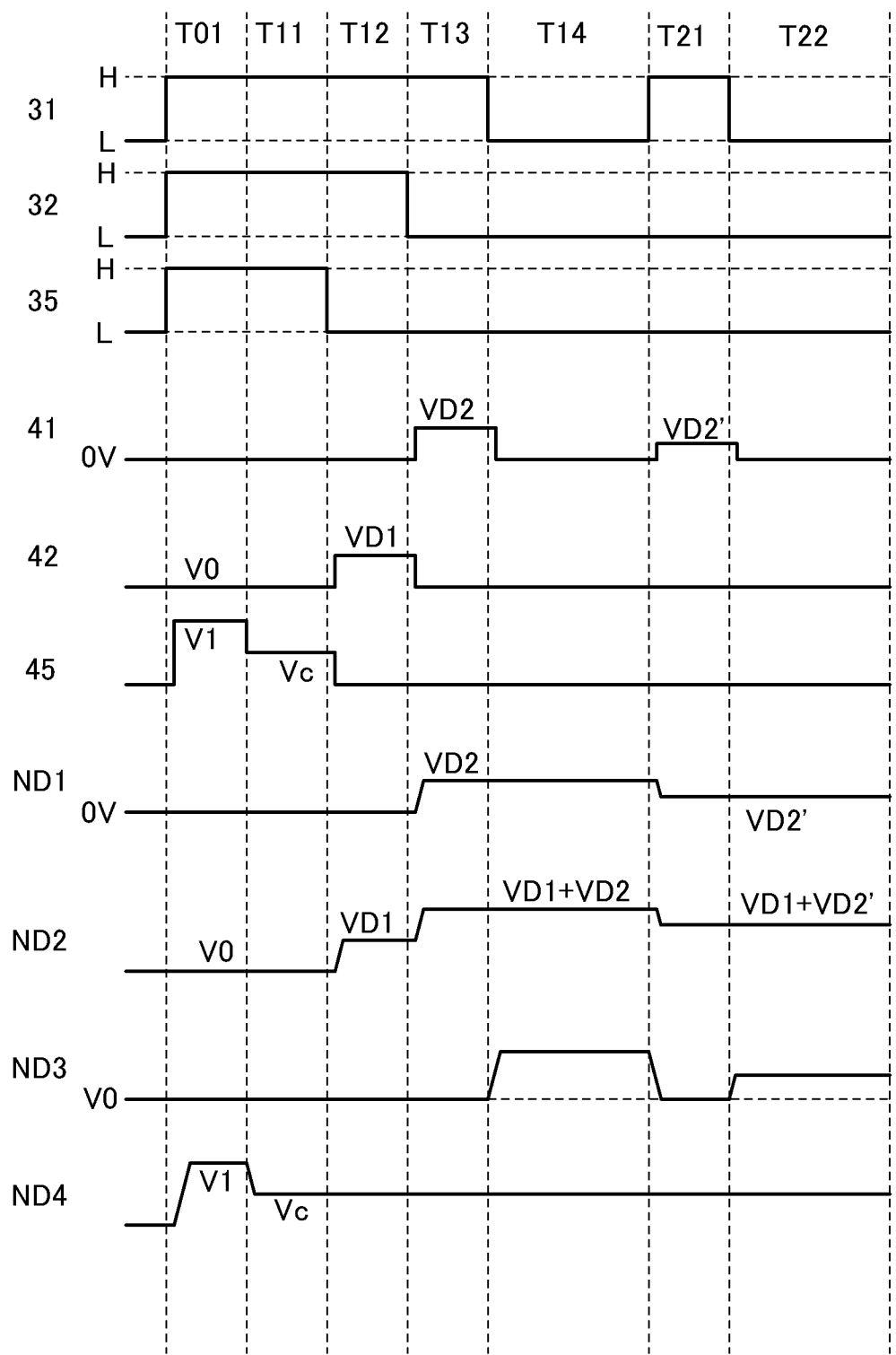
FIG. 2 is a timing chart illustrating an example of a method for operating a pixel.
Figure 3A:
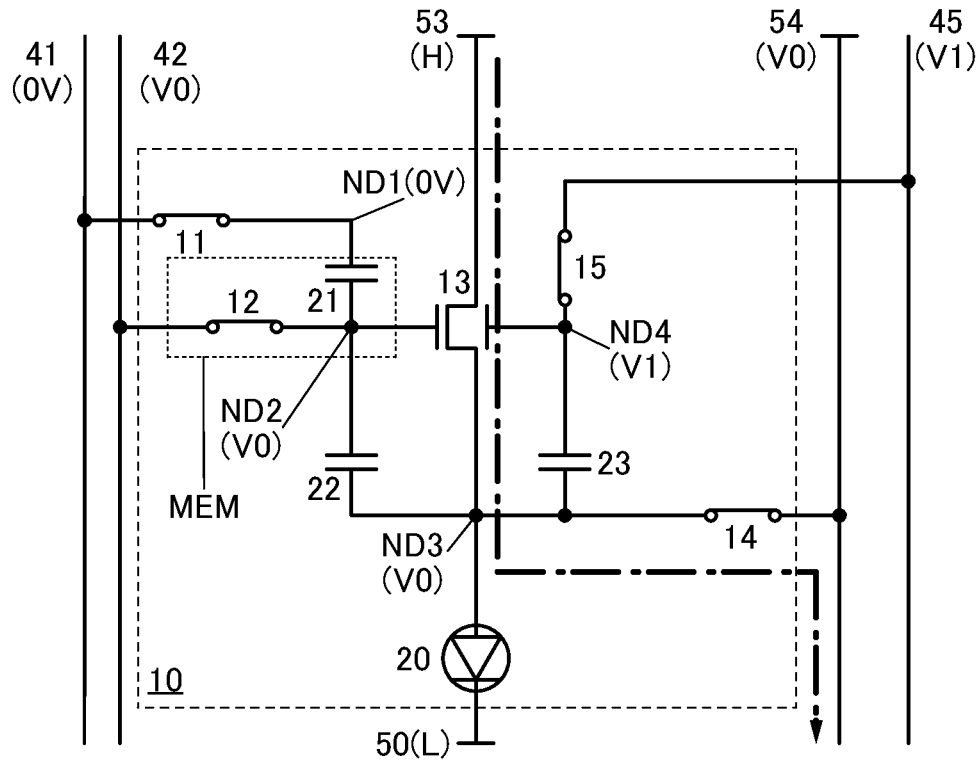
FIG. 3A and FIG. 3B are circuit diagrams illustrating an example of a method for operating a pixel.
Figure 3B:
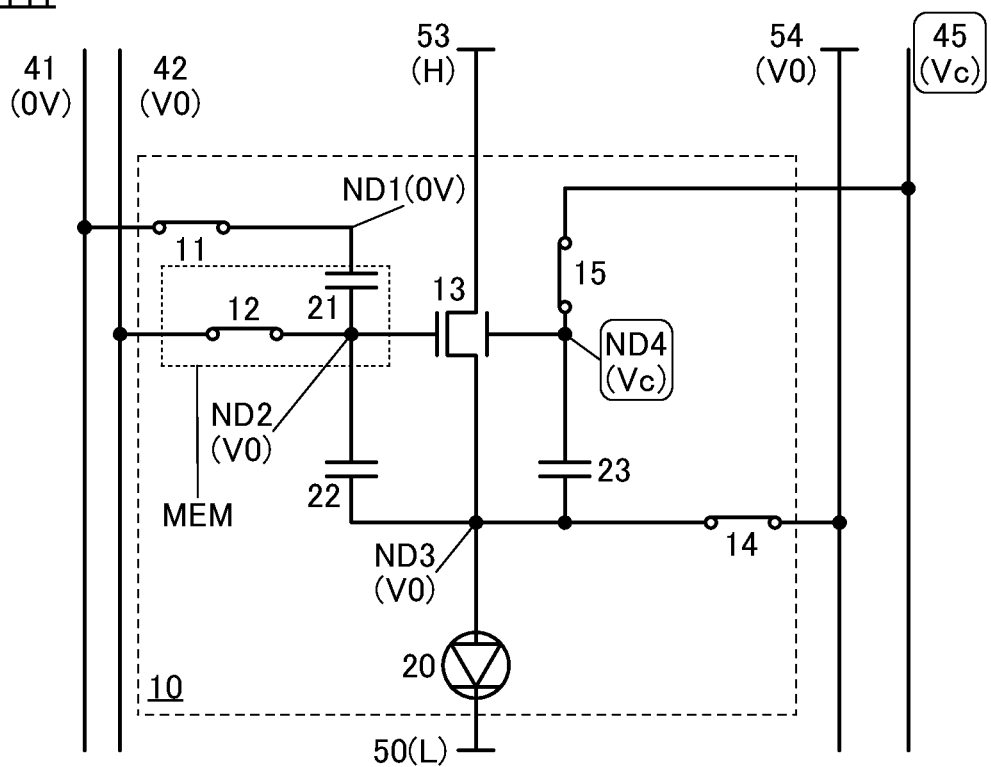
Figure 4A:
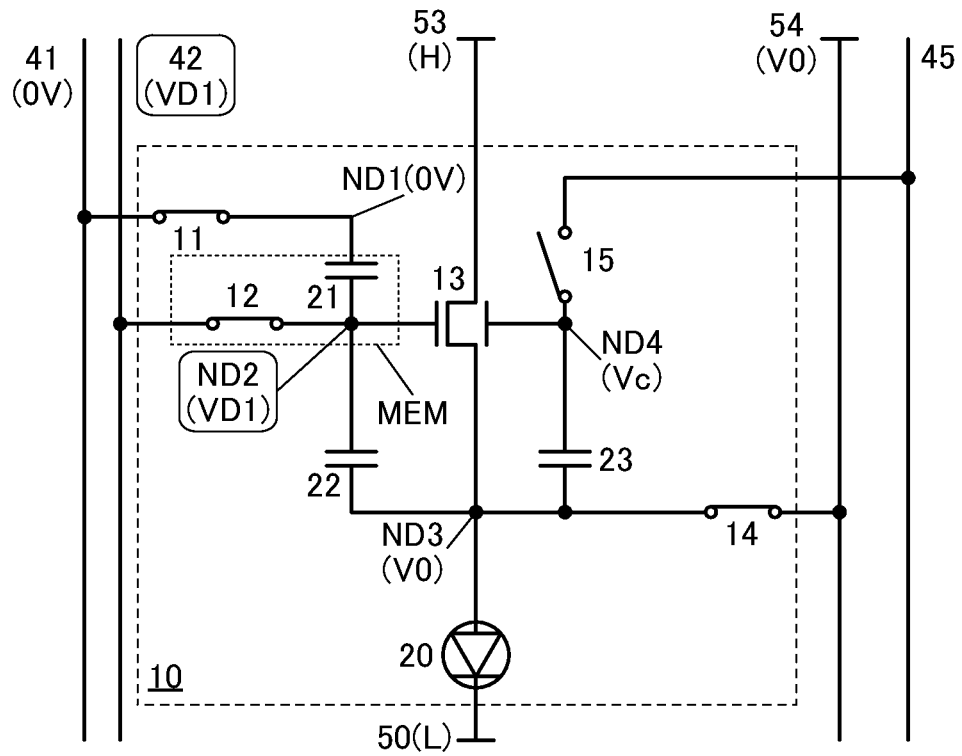
FIG. 4A and FIG. 4B are circuit diagrams illustrating an example of a method for operating a pixel.
Figure 4B:
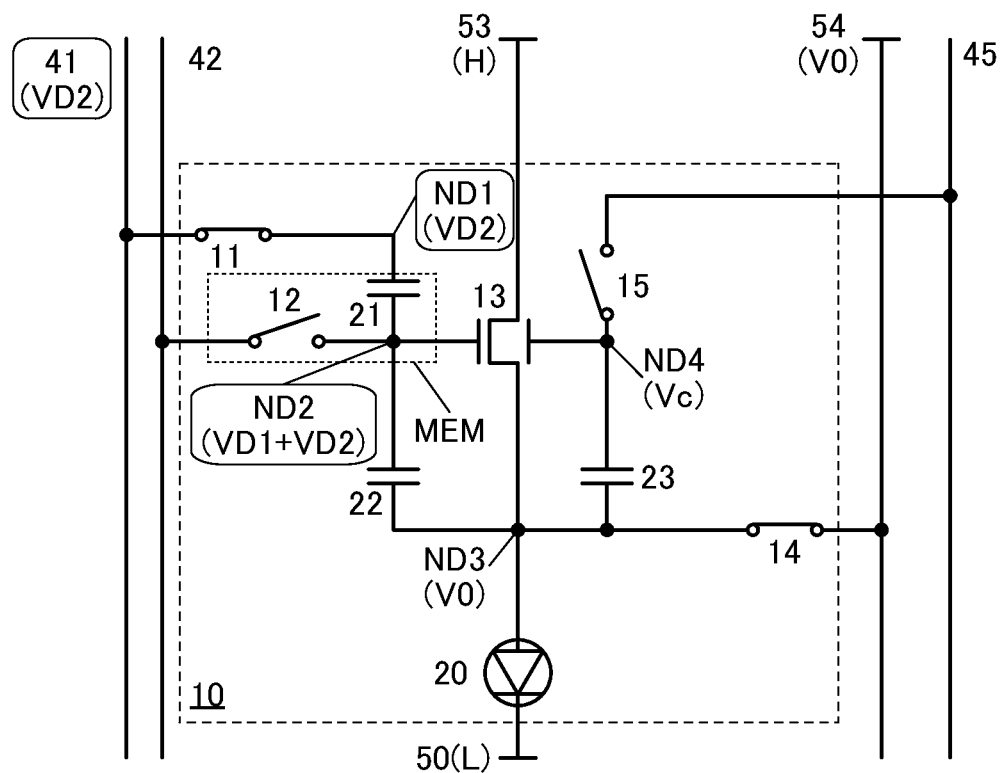
Figure 5A:
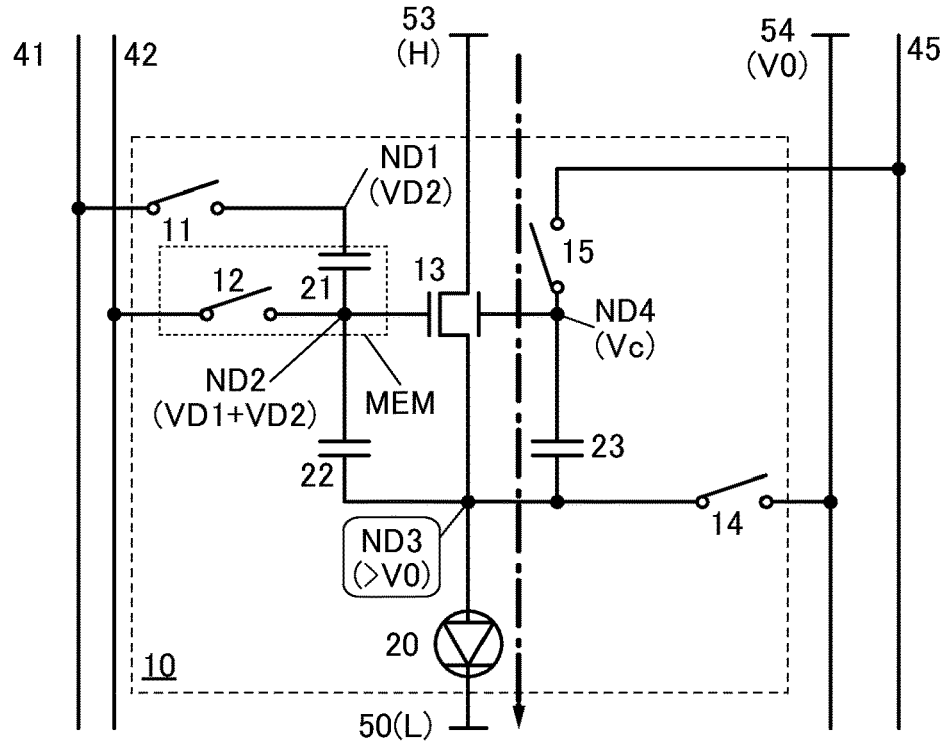
FIG. 5A and FIG. 5B are circuit diagrams illustrating an example of a method for operating a pixel.
Figure 5B:
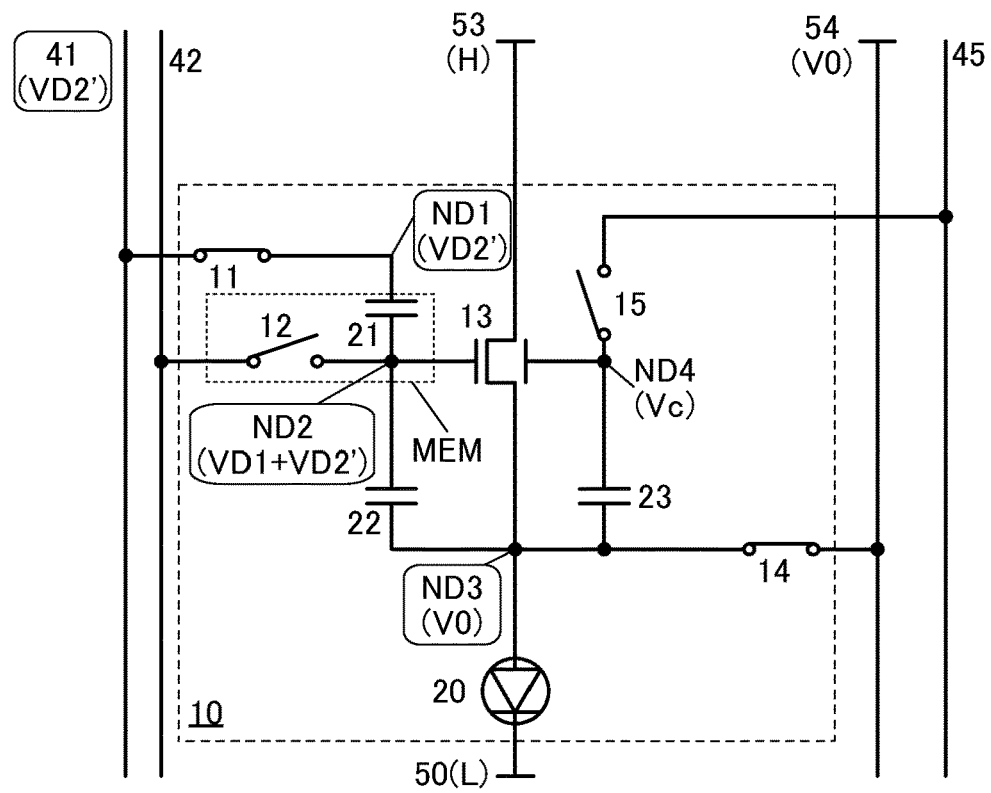
Figure 6:
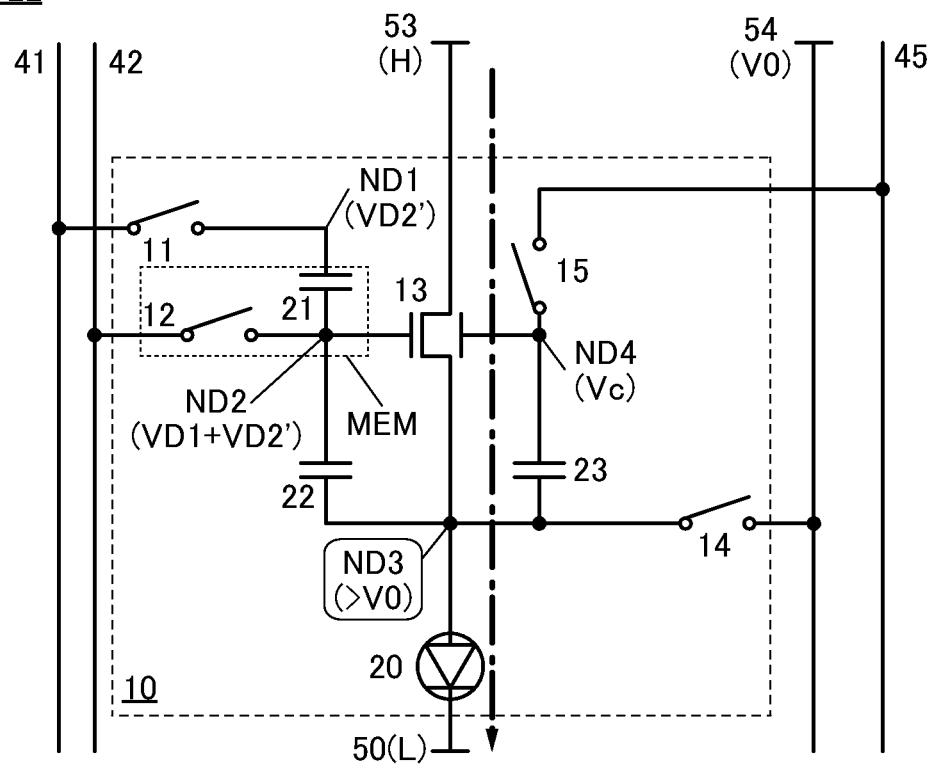
FIG. 6 is a circuit diagram illustrating an example of a method for operating a pixel.

FIG. 2 is a timing chart illustrating an example of a method for operating the pixel 10 with the configuration illustrated in FIG. 1. FIG. 2 shows operations of the pixel 10 divided into a period T01, a period T11, a period T12, a period T13, a period T14, a period T21, and a period T22. FIG. 3 to FIG. 6 are diagrams illustrating the on/off of the transistors, the potentials of the wirings and nodes, and the direction of current flow in each period illustrated in FIG. 2. Here, in FIG. 2 to FIG. 6 and the like, "H" means a high potential and "L" means a low potential.

In this specification and the like, a high potential means a potential higher than a low potential. For example, the high potential means a potential for turning on an n-channel transistor, and the low potential means a potential for turning off an n-channel transistor. Alternatively, the high potential means a potential for turning off a p-channel transistor, and the low potential means a potential for turning on a p-channel transistor. For example, the high potential can be a positive potential, and the low potential can be a ground potential or a negative potential.

FIG. 2 to FIG. 6 show the method for operating the pixel 10 assuming that a low potential, a high potential, and a potential VO are supplied respectively to the wiring 50, the wiring 53, and the wiring 54. Note that the potential VO is a potential lower than the potential of the wiring 53.

In addition, FIG. 2 to FIG. 6 show the method for operating the pixel 10 assuming that all the transistors 11 to 15 are n-channel transistors. The operation method illustrated in FIG. 2 to FIG. 6 can be referred to even in the case where some or all of the transistors 11 to 15 are p-channel transistors by appropriately interchanging the magnitude relation between the potentials or the like.

In order to clarify the on/off, switch symbols are used to denote the transistors other than the transistor 13, and the wiring 31, the wiring 32, and the wiring 35 are omitted in FIG. 3 to FIG. 6. Reference numerals denoting a wiring and a node whose potential is changed from the immediately preceding period are enclosed by a solid line.

In the period T01 (see FIG. 2 and FIG. 3A), the potential of the wiring 31, the potential of the wiring 32, and the potential of the wiring 35 are set to a high potential, and then the potential of the wiring 42 is set to the potential V0 and the potential of the wiring 45 is set to a potential V1. Thus, the transistor 11, the transistor 12, the transistor 14, and the transistor 15 are turned on, and the potential of the node ND2 and the potential of the node ND3 become the potential V0 and the potential of the node ND4 becomes the potential V1. Accordingly, current flows from the wiring 53 to the wiring 54 through the transistor 13. The current is detected by a circuit provided outside the pixel 10. Note that the potential of the wiring 42 is not necessarily equal to the potential V0 that is the potential of the wiring 54. In addition, although the potential of the wiring 41 can be a given potential, the following description is made assuming that the potential is 0V.

Here, it is preferable that the potential V0 be a potential at which current does not flow through the display element 20. For example, the value of the potential V0 is preferably set so that a voltage applied to the display element 20 is lower than or equal to the threshold voltage of the display element 20. For example, the potential V0 is preferably a low potential equal to the potential of the wiring 50. Thus, the current flowing through the transistor 13 can be accurately detected. In addition, abnormal display can be inhibited.

In the period T11 (see FIG. 2 and FIG. 3B), the potential of the wiring 45 is set to a potential Vc that is a potential calculated on the basis of the current detected in the period T01. Thus, the potential of the node ND4 becomes the potential Vc, and the potential of the back gate of the transistor 13 becomes the potential Vc. The potential Vc is a potential at which the current flowing through the transistor 13 is lower than or equal to a certain value in the case where the transistor 14 is in an on state, for example. For example, the potential Vc is calculated so that the threshold voltage of the transistor 13 is a difference between the potential of the node ND2 and the potential of the node ND3 in the period T11. In the case illustrated in FIG. 3B, the difference between the potential of the node ND2 and the potential of the node ND3 is 0V, and thus the potential Vc can be calculated so that the threshold voltage of the transistor 13 is 0V, for example.

Accordingly, the threshold voltage of the transistor 13, which is a driving transistor, is corrected. Thus, the period T01 and the period T11 can be referred to as threshold voltage correction periods. Here, when the potential V1 is set to be as high as possible, the current flowing through the transistor 13 in the period T01 becomes large, which is preferable in terms of highly accurate correction of the threshold voltage.

In the period T12 (see FIG. 2 and FIG. 4A), the potential of the wiring 35 is set to a low potential. Thus, the transistor 15 is turned off, and the potential of the node ND4 is retained at the potential Vc. After that, the potential of the wiring 42 is set to a potential VD1 that is a potential corresponding to first data. Thus, the potential of the node ND2 becomes the potential VD1 and the first data is written to the memory circuit MEM. Here, the first data can be image correction data or image data. Note that the potential of the wiring 45 can be a given potential.

Accordingly, the period T12 can be referred to as a writing period of the first data.

In the period T13 (see FIG. 2 and FIG. 4B), the potential of the wiring 32 is set to a low potential. Thus, the transistor 12 is turned off, and the potential of the node ND2 is retained. After that, when the potential of the wiring 41 is set to a potential VD2 that is a potential corresponding to second data, the potential of the node ND1 changes from 0 V to the potential VD2. That is, the potential of the node ND1 is increased by the potential VD2. Here, the node ND2 is in a floating state; therefore, when the capacitive coupling coefficient of the node ND2 is 1, the potential of the node ND2 becomes a potential "VD1+VD2". Accordingly, the second data is supplied to the pixel 10, and the data retained in the memory circuit MEM becomes third data in which the second data is added to the first data. Here, the second data can be image data. Note that the potential of the wiring 42 can be a given potential.

In this specification and the like, in the case where both the first data and the second data are image data, the first data might be referred to as the first image data, and the second data might be referred to as the second image data.

Accordingly, the period T13 can be referred to as a writing period of the second data.

In the period T14 (see FIG. 2 and FIG. 5A), the potential of the wiring 31 is set to a low potential. Thus, the transistor 11 and the transistor 14 are turned off. The transistor 11 is turned off, whereby the potential of the node ND1 is retained. In addition, the transistor 14 is turned off, whereby the potential of the node ND3 is increased in accordance with the potential of the node ND2. Thus, a current corresponding to the potential difference between the node ND3 and the wiring 50 flows through the display element 20. Therefore, an image corresponding to the potential of the node ND2, i.e., an image corresponding to the third data, is displayed by the display element 20. For example, in the case where data corresponding to the potential VD1 is image correction data and data corresponding to the potential VD2 is image data, an image corresponding to the corrected image data is displayed by the display element 20. In the case where the data corresponding to the potential VD1 is the first image data and the data corresponding to the potential VD2 is the second image data, an image in which an image corresponding to the first image data and an image corresponding to the second image data are superimposed is displayed by the display element 20.

Accordingly, the period T14 can be referred to as a reading period of the third data.

In the period T21 (see FIG. 2 and FIG. 5B), the potential of the wiring 31 is set to a high potential. Thus, the transistor 11 and the transistor 14 are turned on. After that, the potential of the wiring 41 is set to a potential VD2' that is a potential corresponding to the second data. The transistor 11 is turned on and the potential of the wiring 41 becomes the potential VD2', whereby the potential of the node ND2 becomes the potential "VD1+VD2'" when the capacitive coupling coefficient of the node ND2 is 1. Accordingly, the second data is supplied to the pixel 10, and the data retained in the memory circuit MEM becomes the third data in which the second data is added to the first data. Here, the potential VD2' can be a potential different from the potential VD2. For example, the potential VD2' can be a potential corresponding to image data of the next frame to the image data supplied to the pixel 10 in the period T13.

In addition, the transistor 14 is turned on, whereby the potential of the node ND3 becomes the potential V0 that is the potential of the wiring 54. Thus, current does not flow through the display element 20.

In the period T22 (see FIG. 2 and FIG. 6), the potential of the wiring 31 is set to a low potential. Thus, the transistor 11 and the transistor 14 are turned off. The transistor 11 is turned off, whereby the potential of the node ND1 is retained. In addition, the transistor 14 is turned off, whereby the potential of the node ND3 is increased in accordance with the potential of the node ND2. Thus, a current corresponding to the potential difference between the node ND3 and the wiring 50 flows through the display element 20. Therefore, an image corresponding to the potential of the node ND2, i.e., an image corresponding to the third data, is displayed by the display element 20.

Accordingly, the period T21 can be referred to as the writing period of the second data, and the period T22 can be referred to as the reading period of the third data. That is, the period T21 is a period in which the same kind of operations as those in the period T13 are performed, and the period T22 is a period in which the same kind of operations as those in the period T14 are performed. In addition, the period T13 and the period T14 constitute one frame period, and the period T21 and the period T22 constitute the next one frame period.

Here, between the period T14 and the period T21, the potential Vc that is a potential corresponding to threshold voltage correction data is not supplied to the node ND4 and the potential VD1 that is a potential corresponding to the first data is not supplied to the node ND2. As described above, when an OS transistor or the like is used as the transistor 15, the potential of the node ND4 can be retained for a long period, and when an OS transistor or the like is used as the transistor 12, the potential of the node ND2 can be retained for a long period. Thus, the supply of the potential Vc to the node ND4 and the supply of the potential VD1 to the node ND2 are not necessarily performed every frame period; therefore, the display device of one embodiment of the present invention can be operated at high speed.

Accordingly, in the display device of one embodiment of the present invention, the threshold voltage of the transistor 13 that is the driving transistor can be corrected without a correction of the image data supplied to the pixel 10. Thus, the threshold voltage of the transistor 13 can be corrected without increasing a dynamic range (a difference between the maximum value and the minimum value of a potential that a signal corresponding to image data can have) of the image data. Therefore, the increase in the increase amount of the potential of a signal corresponding to the image data at the time when the luminance of light emitted from the display element is increased by one gray level, which is due to the correction of the threshold voltage of the transistor 13, can be inhibited, for example. Accordingly, the luminance of light emitted from the display element can be accurately controlled, whereby a high-quality image can be displayed by the display element 20. In addition, a data driver circuit or the like, which is a circuit having a function of generating image data, does not need to have high withstand voltage, and the display device can be inexpensive. Furthermore, the power consumption of the display device can be reduced because the output potential of the data driver circuit can be inhibited from being increased.

In addition, the memory circuit MEM is provided in the pixel 10, and the first data can be written to the memory circuit MEM. After the image correction data is written to the memory circuit MEM as the first data, the image data is written to the pixel 10 as the second data, whereby image processing such as noise removal can be performed inside the pixel 10. Thus, arithmetic processing can be simplified compared with the case where the image processing or the like is performed by a direct correction of the image data using an arithmetic circuit or the like provided outside the pixel 10; therefore, the power consumption of the display device of one embodiment of the present invention can be reduced.

Furthermore, after the first image data is written to the memory circuit MEM as the first data, the second image data is supplied to the pixel 10 as the second data, whereby the display element 20 can display an image in which an image corresponding to the first image data and an image corresponding to the second image data are superimposed. The luminance of the superimposed image can be a sum of the luminance of the first image data and the luminance of the second image data. Thus, an image corresponding to image data represented by a signal having a higher potential than a potential that can be generated by the data driver circuit or the like, which is a circuit having a function of generating image data, can be displayed by the display element 20. Accordingly, the display element 20 can display a high-luminance image compared with the case of displaying an image corresponding to only one image data, not a superimposed image data. In addition, a data driver circuit or the like does not need to have high withstand voltage, and thus the display device can be inexpensive. Furthermore, the power consumption of the display device can be reduced because the output potential of the data driver circuit can be inhibited from being increased.

Figure 7:
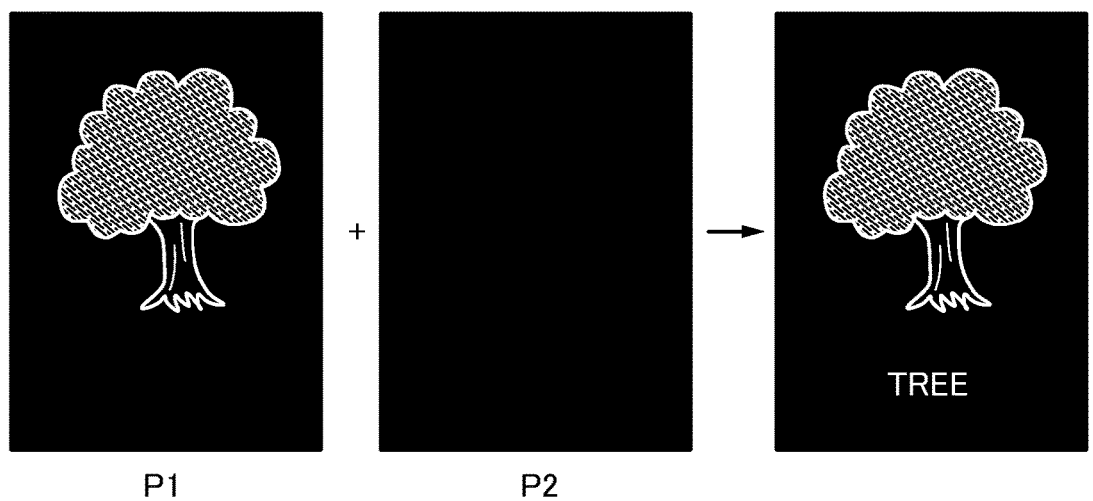
FIG. 7 is a diagram illustrating an operation example of a display device.

Here, the image corresponding to the first image data and the image corresponding to the second image data may be the same or different. FIG. 7 illustrates the case where an image P1 corresponding to the first image data includes a drawing and letters, and an image P2 corresponding to the second image data includes only letters. In this case, when the image P1 and the image P2 are superimposed on each other, the luminance of the letters can be increased, whereby the letters can be emphasized, for example. Note that the image P2 is not limited to an image including only letters, and the image P1 is not limited to an image including a drawing and letters.

As illustrated in FIG. 2 and the like, the potential of the node ND2 is changed in accordance with the potential of the node ND1 after the potential VD1 is supplied to the node ND2; thus, in the case where the first image data that is image data corresponding to the potential of the node ND2 is rewritten, the second image data that is image data corresponding to the potential of the node ND1 also has to be written to the pixel 10 again. On the other hand, in the case where the second image data is rewritten, the first image data does not need to be rewritten unless charges supplied to the node ND2 are retained without leaking through the transistor 12 or the like. Therefore, in the case illustrated in FIG. 7, the luminance of the letters can be controlled by adjusting the potential supplied to the node ND1.

Here, as described above, in the case where the first image data is rewritten, the second image data has to be written to the pixel 10 again. On the other hand, in the case where the second image data is rewritten, the first image data does not need to be rewritten. Therefore, the image P1 is preferably an image that is rewritten less frequently than the image P2.

<Structure Example of Display Device>

Figure 8A:
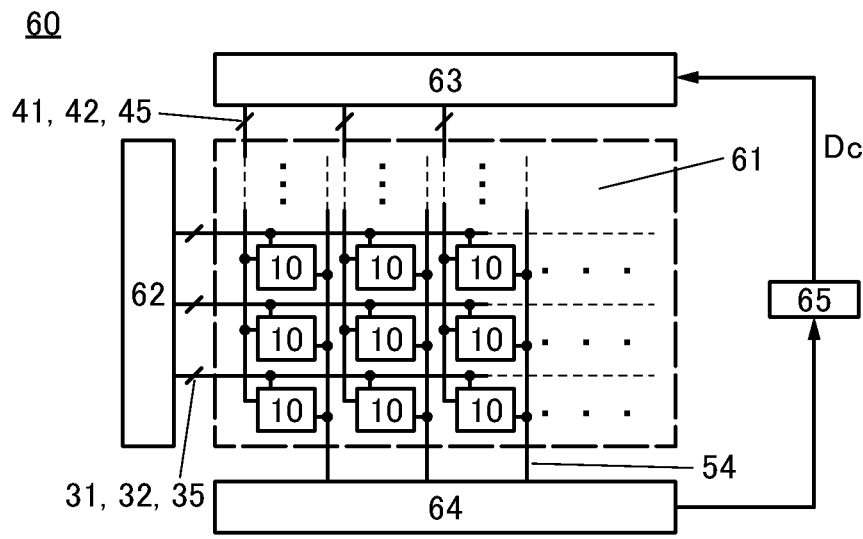
FIG. 8A and FIG. 8B are block diagrams illustrating structure examples of a display device.

FIG. 8A is a block diagram illustrating a structure example of a display device 60 that is the display device of one embodiment of the present invention. The display device 60 includes a display portion 61, a gate driver circuit 62, a data driver circuit 63, a current sensing circuit 64, and a correction data generation circuit 65. Here, in the display portion 61, the pixels 10 are arranged in a matrix.

The gate driver circuit 62 extends in the row direction (the horizontal direction) and is electrically connected to a plurality of wirings 31, 32, and 35 that have a function of scan lines. As described above, the wiring 31, the wiring 32, and the wiring 35 are electrically connected to the pixel 10. The data driver circuit 63 extends in the column direction (the perpendicular direction) and is electrically connected to a plurality of wirings 41, 42, and 45 that have a function of data lines. The current sensing circuit 64 is electrically connected to a plurality of wirings 54 extending in the column direction. As described above, the wiring 41, the wiring 42, the wiring 45, and the wiring 54 are electrically connected to the pixel 10.

The gate driver circuit 62 has a function of generating signals for controlling the on/off of the transistors provided in the pixel 10. For example, the gate driver circuit 62 has a function of generating signals for controlling the on/off of the transistor 11, the transistor 12, the transistor 14, and the transistor 15. The data driver circuit 63 has a function of generating threshold voltage correction data and the first and the second data.

Here, as described above, the data driver circuit 63 does not need to have high withstand voltage. Thus, the display device 60 can be inexpensive. In addition, the power consumption of the display device 60 can be reduced because the output potential of the data driver circuit can be inhibited from being increased.

The current sensing circuit 64 has a function of sensing a current flowing through the wiring 54, generating data representing the value of the current, and supplying the generated data to the correction data generation circuit 65. The correction data generation circuit 65 has a function of generating threshold voltage correction data Dc on the basis of the data supplied from the current sensing circuit 64 and the like and supplying the threshold voltage correction data Dc to the data driver circuit 63. The data driver circuit 63 can set the potential of the wiring 45 to the potential Vc that is a potential corresponding to the supplied threshold voltage correction data Dc. Note that the correction data generation circuit 65 can generate the threshold voltage correction data Dc on the basis of, in addition to the data representing the value of the current flowing through the wiring 54, data representing a potential difference between the gate and source (Vgs) and a potential difference between the gate and drain (Vds) of the transistor 13 at the time when the current flows, for example.

Figure 8B:
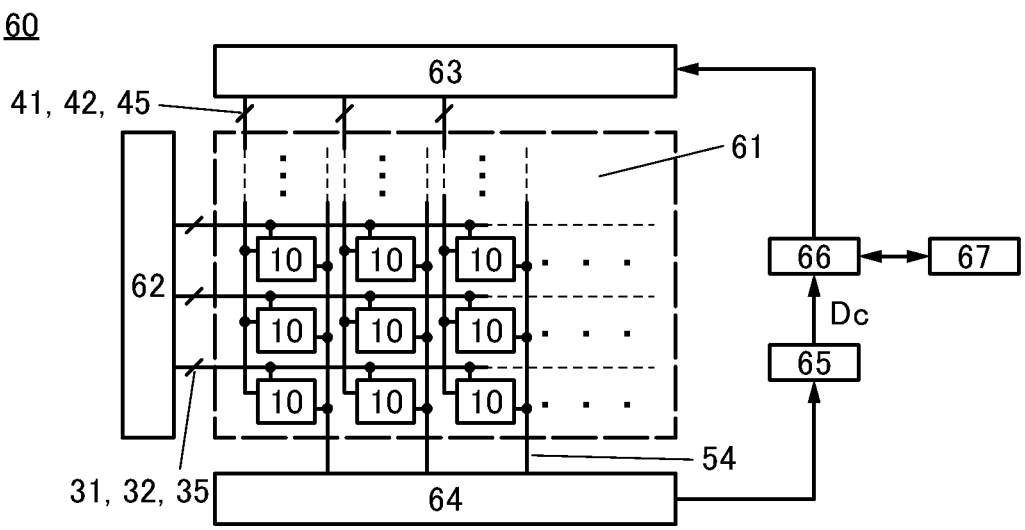

FIG. 8B is a block diagram illustrating a structure example of the display device 60, and is a modification example of the display device 60 with the structure illustrated in FIG. 8A. The display device 60 with the structure illustrated in FIG. 8B is different from the display device 60 with the structure illustrated in FIG. 8A in being provided with a memory device 66 and a memory device 67.

In the display device 60 with the structure illustrated in FIG. 8B, the threshold voltage correction data Dc in each of the pixels 10, which is generated by the correction data generation circuit 65, is written to the memory device 66. The threshold voltage correction data Dc written to the memory device 66 is read out at predetermined timing, and supplied to the data driver circuit 63. The memory device 66 is preferably a volatile memory such as a DRAM (Dynamic Random Access Memory) or an SRAM (Static Random Access Memory). Thus, the memory device 66 can be operated at high speed, whereby the display device 60 can be operated at high speed.

The threshold voltage correction data Dc written to the memory device 66 is also written to the memory device 67. The memory device 67 can retain data for a longer time than the memory device 66, and the threshold voltage correction data Dc retained in the memory device 67 is supplied to the memory device 66 as necessary. The memory device 67 is preferably a nonvolatile memory such as a hard disk drive (HDD), a solid state drive (SSD), or a flash memory, for example. When the memory device 67 is a nonvolatile memory, for example, even in the case where the power supply to the display device 60 is stopped and data retained in the memory device 66 that is a nonvolatile memory is lost, the data can be recovered immediately by the supply of the data from the memory device 67 to the memory device 66. Note that the threshold voltage correction data Dc is not directly written from the correction data generation circuit 65 to the memory device 67, and the memory device 67 does not supply the retained data directly to the data driver circuit 63. Thus, the operation speed of the display device 60 does not decrease significantly even when the operation speed of the memory device 67 is low.

As described above, an OS transistor is characterized by an extremely low off-state current. Thus, when the memory device 67 includes an OS transistor, the memory device 67 can be a nonvolatile memory. In addition, when the memory device 67 is a nonvolatile memory including an OS transistor, the structure of the memory device 67 can be simplified than that of an HDD, an SSD, a flash memory, or the like. Thus, the fabrication process of the memory device 67 can be simplified, and the display device 60 can be inexpensive.

Accordingly, when the display device 60 has the structure illustrated in FIG. 8B, the threshold voltage correction data Dc can be retained for a longer period than a period for which the threshold voltage correction data Dc is retained inside the pixel 10. Thus, the frequency of the generation of the threshold voltage correction data Dc by the correction data generation circuit 65 that is performed in the period T01 illustrated in FIG. 2 can be reduced, so that the display device 60 can be operated at high speed.

<Structure Example 2 of Pixel>

Figure 9:
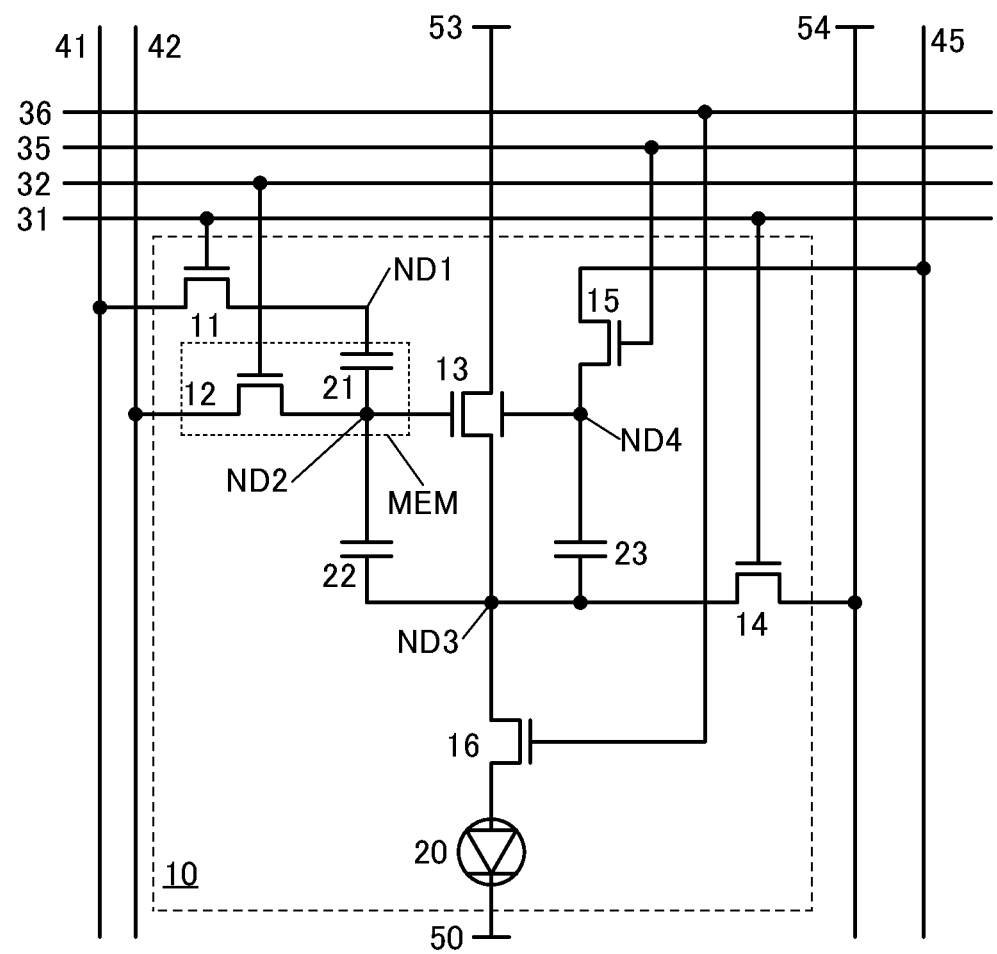
FIG. 9 is a circuit diagram illustrating a configuration example of a pixel.

FIG. 9 is a diagram illustrating a configuration example of the pixel 10, and is a modification example of the configuration of the pixel 10 illustrated in FIG. 1. The pixel 10 with the configuration illustrated in FIG. 9 is different from the pixel 10 illustrated in FIG. 1 in being provided with a transistor 16.

In the pixel 10 with the configuration illustrated in FIG. 9, the one of the source and the drain of the transistor 13, the one of the source and the drain of the transistor 14, one of a source and a drain of the transistor 16, the other electrode of the capacitor 22, and the one electrode of the capacitor 23 are electrically connected to the node ND3. The other of the source and the drain of the transistor 16 is electrically connected to the one electrode of the display element 20. A gate of the transistor 16 is electrically connected to the wiring 36. The wiring 36 has a function of a scan line and is electrically connected to the gate driver circuit 62 illustrated in FIG. 8A and FIG. 8B.

The transistor 16 can be turned off while the transistor 14 is turned on, and the transistor 16 can be turned on while the transistor 14 is turned off. That is, a complementary signal of a signal supplied to the gate of the transistor 14 can be supplied to the gate of the transistor 16. For example, when the potential of the wiring 31 electrically connected to the gate of the transistor 14 is a high potential, the potential of the wiring 36 electrically connected to the gate of the transistor 16 can be a low potential, and when the potential of the wiring 31 is a low potential, the potential of the wiring 36 is a high potential.

In the pixel 10 with the structure illustrated in FIG. 9, current can be inhibited from flowing through the display element 20 in periods other than the data reading period, e.g., the period T01, the period T11 to the period T13, and the period T21 illustrated in FIG. 2 and the like. Thus, a current flowing through the transistor 13 toward the wiring 54 can be accurately detected by the current sensing circuit 64 illustrated in FIG. 8A and FIG. 8B. In addition, abnormal display can be inhibited.

<Structure Example 3 of Pixel>

Figure 10A:
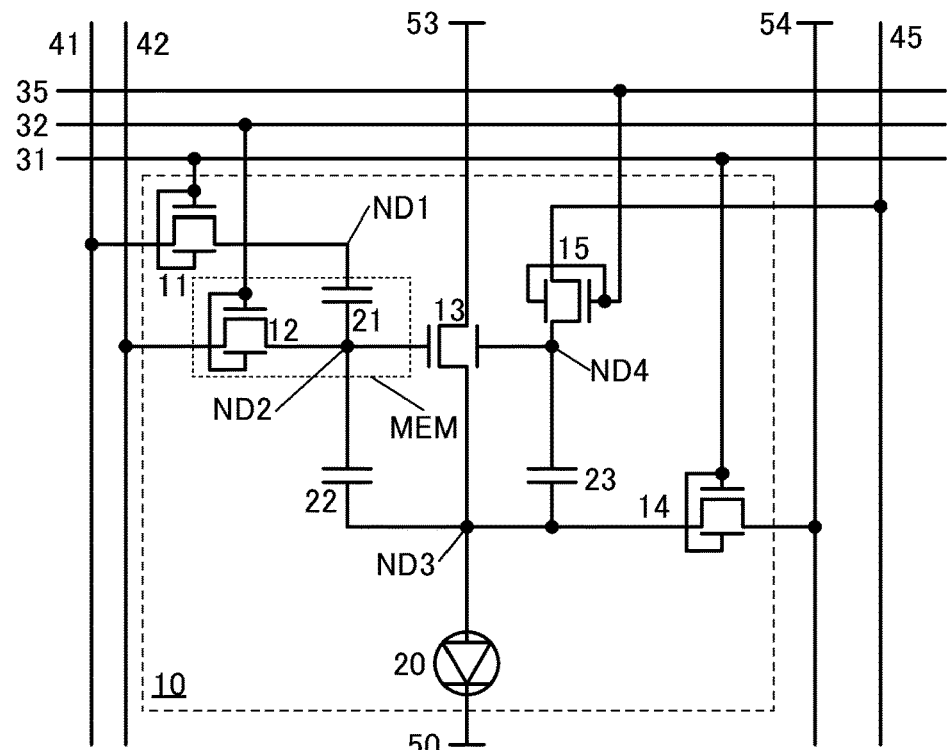
FIG. 10A and FIG. 10B are circuit diagrams illustrating configuration examples of a pixel.
Figure 10B:
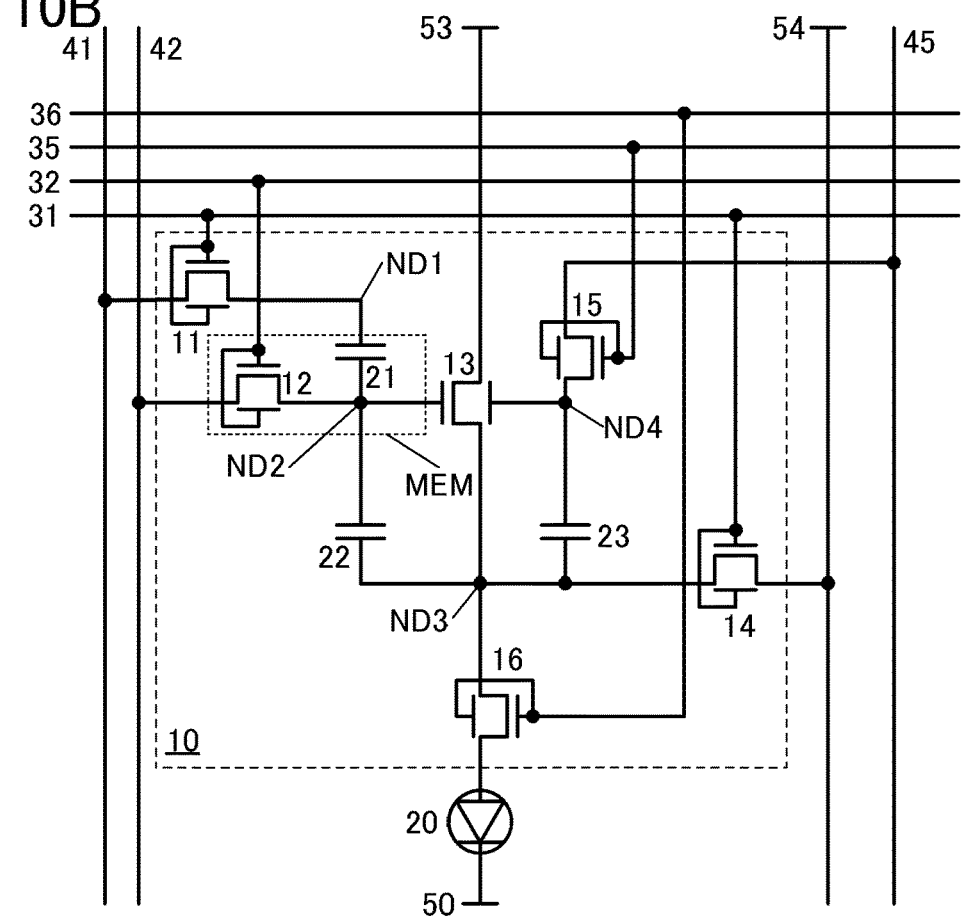

FIG. 10A and FIG. 10B are diagrams illustrating configuration examples of the pixel 10. In the pixel 10 with the configuration illustrated in FIG. 10A, back gates are provided in the transistor 11, the transistor 12, the transistor 14, and the transistor 15 that are included in the pixel 10 with the configuration illustrated in FIG. 1. In addition, in the pixel 10 with the configuration illustrated in FIG. 10B, back gates are provided in the transistor 11, the transistor 12, and the transistor 14 to the transistor 16 that are included in the pixel 10 with the configuration illustrated in FIG. 9. The back gates are electrically connected to front gates and have an effect of increasing on-state currents of the transistors. A configuration in which different potentials can be supplied to the back gates and the front gates may be employed. With such a configuration, the threshold voltages of the transistors can be controlled. Note that although FIG. 10A and FIG. 10B illustrate configurations in which all of the transistors are provided with back gates, the pixel 10 may include a transistor not provided with a back gate.

<Structure Example 4 of Pixel>

Figure 11A:
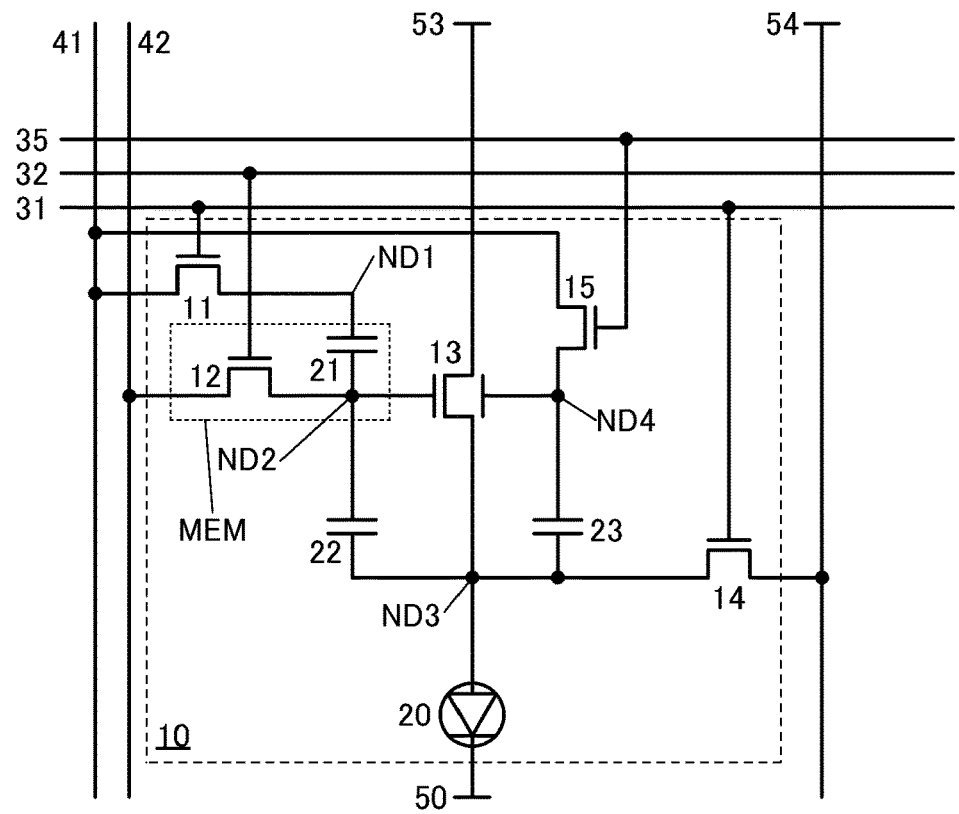
FIG. 11A and FIG. 11B are circuit diagrams illustrating configuration examples of a pixel.

FIG. 11A is a diagram illustrating a configuration example of the pixel 10, and is a modification example of the configuration of the pixel 10 illustrated in FIG. 1. The pixel 10 with the configuration illustrated in FIG. 11A is different from the pixel 10 with the configuration illustrated in FIG. 1 in that the other of the source and the drain of the transistor 15 is electrically connected not to the wiring 45 but to the wiring 41.

FIG. 2 to FIG. 6 can be referred to for a method for operating the pixel 10 with the configuration illustrated in FIG. 11A. Here, the potential of the wiring 41 is set to the potential V1 in the period T01, and the potential of the wiring 41 is set to the potential Vc in the period T11. Note that the potential of the wiring 41 after the period T12 can be equal to that illustrated in FIG. 2 and the like.

Figure 11B:
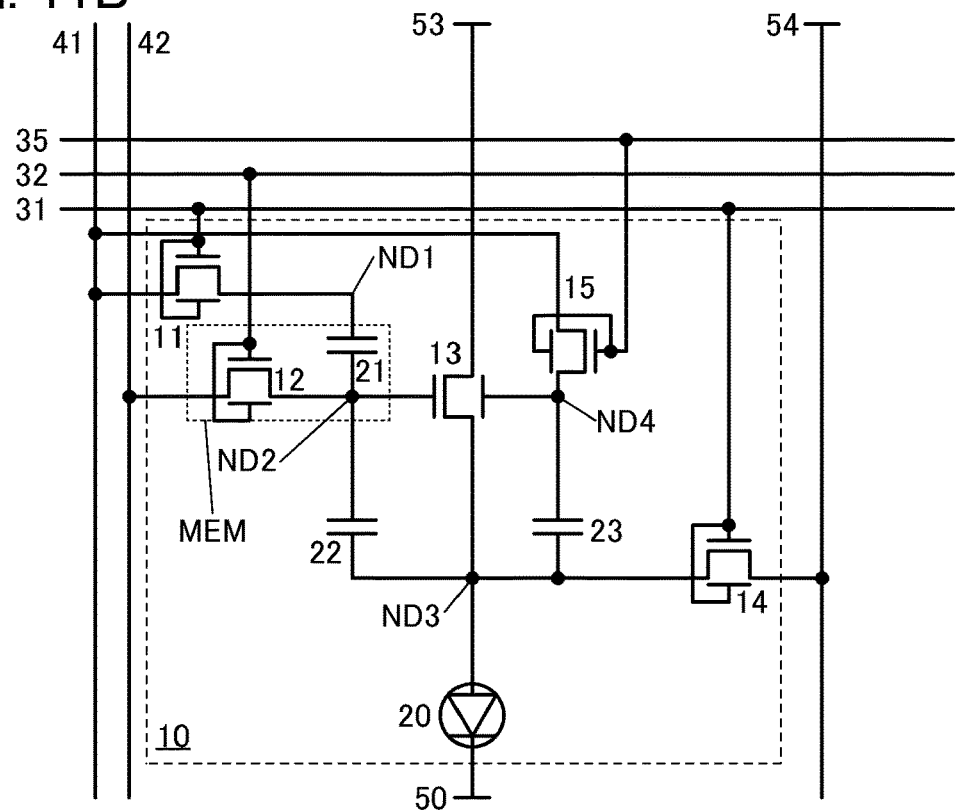

In the pixel 10 with the configuration illustrated in FIG. 11B, back gates are provided in the transistor 11, the transistor 12, the transistor 14, and the transistor 15 that are included in the pixel 10 with the configuration illustrated in FIG. 11A. Note that although FIG. 11B illustrates a configuration in which all of the transistors are provided with back gates, the pixel 10 may include a transistor not provided with a back gate.

<Example 2 of Method for Operating Pixel>

Figure 12:
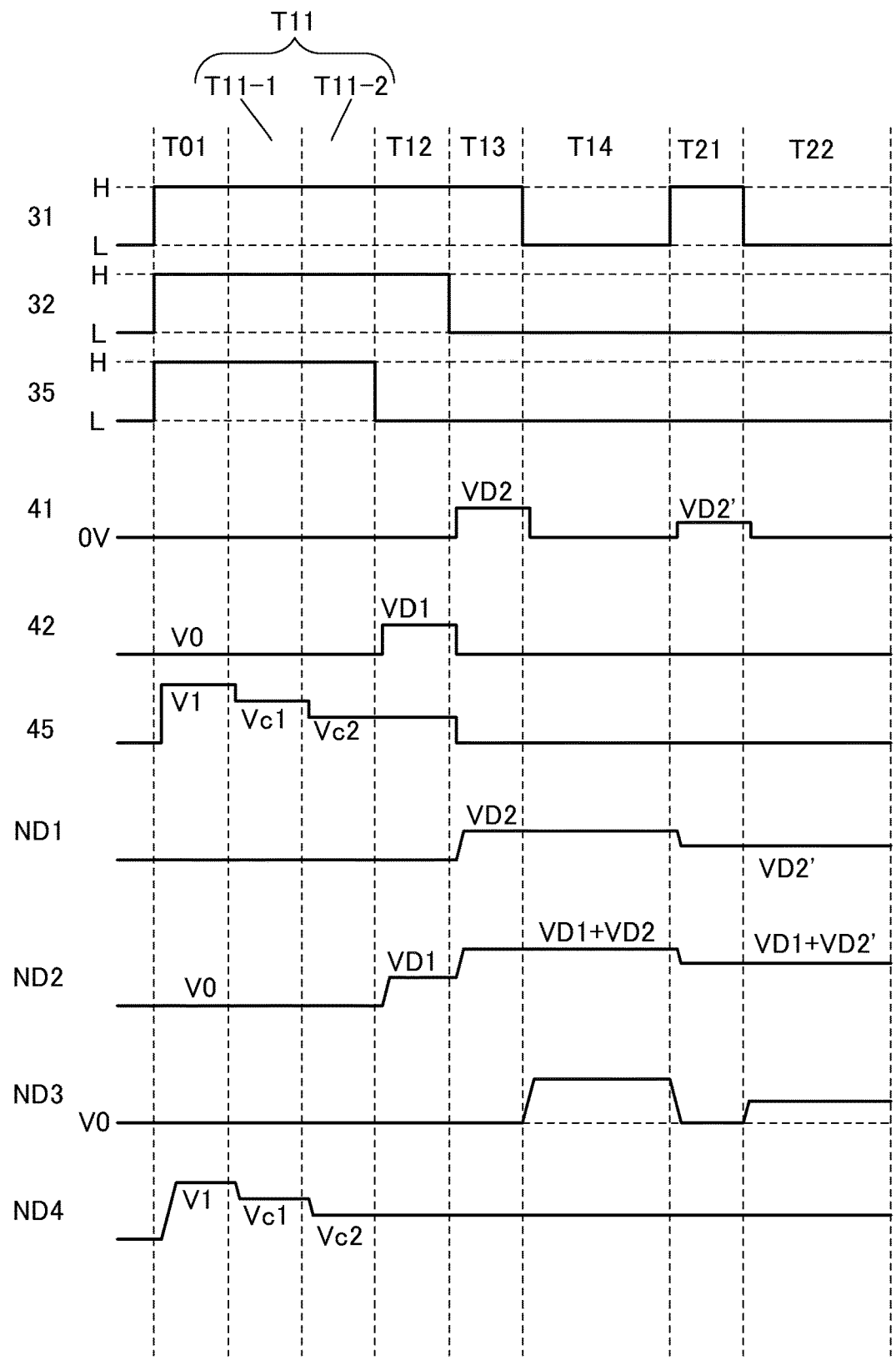
FIG. 12 is a timing chart illustrating an example of a method for operating a pixel.

FIG. 12 is a timing chart illustrating an example of a method for operating the pixel 10 having the configuration illustrated in FIG. 1, and is a modification example of the operation method illustrated in FIG. 2. The operation method illustrated in FIG. 12 is different from the operation method illustrated in FIG. 2 in that the threshold voltage of the transistor 13 is corrected twice in the period T11. Specifically, in a period T11-1, the potential of the wiring 45 is set to a potential Vc1 that is a potential calculated on the basis of a current detected in the period T01. Thus, the potential of the node ND4 becomes the potential Vc1. After that, the current flowing to the wiring 54 through the transistor 13 is detected again, and in the period T11-2, the potential of the wiring 45 is set to a potential Vc2 that is a potential calculated on the basis of the detected current. Thus, the potential of the node ND4 becomes the potential Vc1. Note that the threshold voltage may be corrected three or more times.

When the threshold voltage is corrected a plurality of times, the threshold voltage can be corrected accurately. Thus, a high-quality image can be displayed by the display element 20.

<Example 3 of Method for Operating Pixel>

Figure 13:
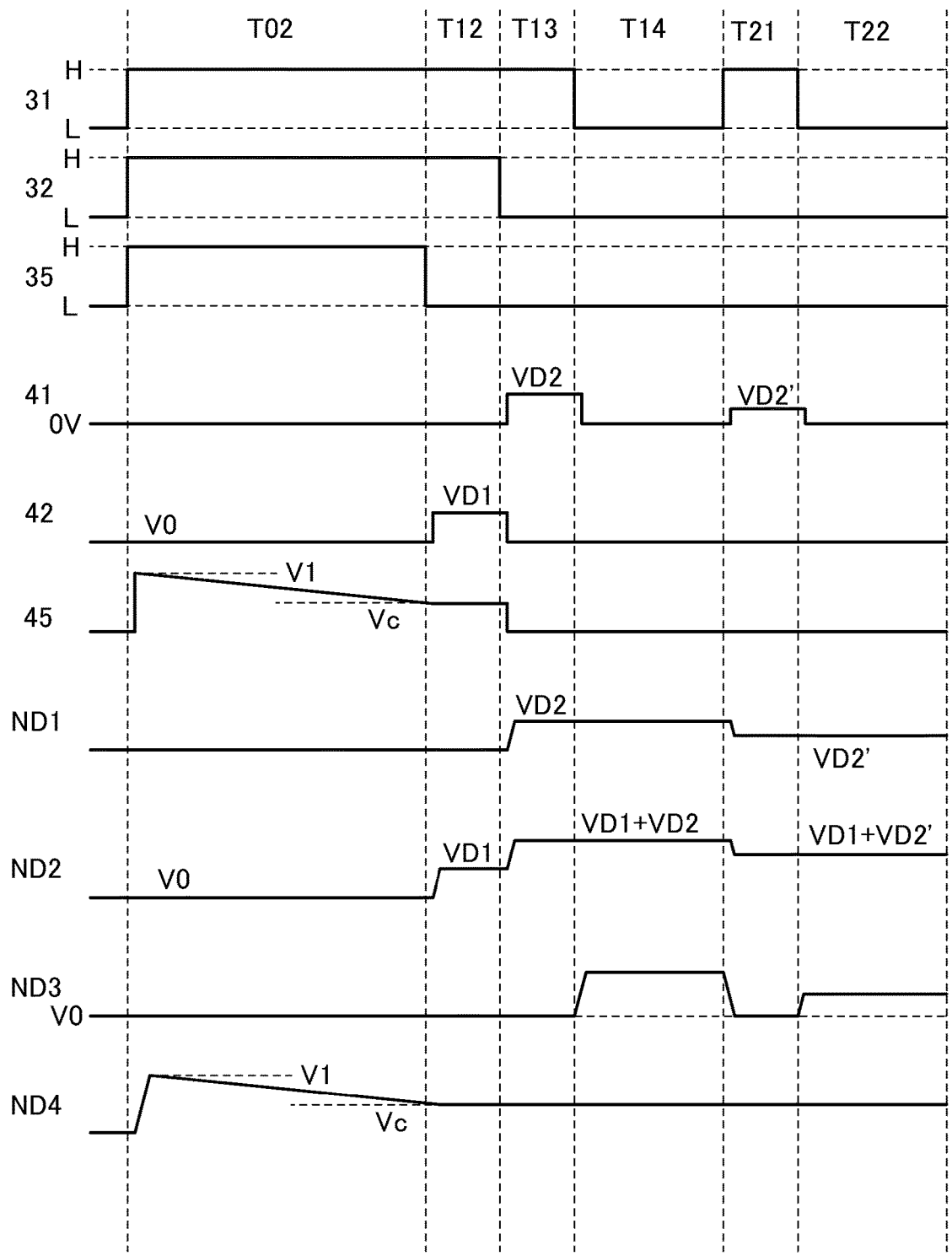
FIG. 13 is a timing chart illustrating an example of a method for operating a pixel.

FIG. 13 is a timing chart illustrating an example of a method for operating the pixel 10 with the configuration illustrated in FIG. 1, and is a modification example of the operation method illustrated in FIG. 2. The operation method illustrated in FIG. 13 is different from the operation method illustrated in FIG. 2 in that an operation illustrated in a period T02 is performed instead of operations illustrated in the period T01 and the period T11.

In the period T02, the potential of the wiring 31, the potential of the wiring 32, and the potential of the wiring 35 are set to a high potential, and then the potential of the wiring 42 is set to the potential V0 and the potential of the wiring 45 is set to the potential V1. Thus, the transistor 11, the transistor 12, the transistor 14, and the transistor 15 are turned on, and the potential of the node ND2 and the potential of the node ND3 become the potential V0 and the potential of the node ND4 becomes the potential V1. Accordingly, current flows from the wiring 53 to the wiring 54 through the transistor 13. The current is detected by the circuit provided outside the pixel 10. Note that as in the case illustrated in FIG. 2, the potential of the wiring 42 is not necessarily equal to the potential V0 that is the potential of the wiring 54. In addition, although the potential of the wiring 41 can be a given potential, the following description is made assuming that the potential is 0V.

After the potential of the wiring 45 is set to the potential V1, the potential of the wiring 45 is decreased by being swept. Thus, the potential of the node ND4 is also decreased, so that the threshold voltage of the transistor 13 is increased and the current flowing to the wiring 54 through the transistor 13 is decreased. Then, when the current flowing to the wiring 54 through the transistor 13 becomes lower than or equal to a certain value, the above sweep operation is stopped. The above is the operation in the period T02.

Here, when the potential of the wiring 45 at the end of the sweep operation is the potential Vc, the potential of the node ND4 is the potential Vc. Accordingly, the potential of the back gate of the transistor 13 becomes the potential Vc, and the threshold voltage of the transistor 13 is corrected.

After the period T02, the operation similar to the operation after the period T12 illustrated in FIG. 2 is performed. The above is the operation method illustrated in FIG. 13.

When the potential of the wiring 45 is swept to correct the threshold voltage of the transistor 13 as illustrated in FIG. 13, the correction data generation circuit 65, the memory device 66, and the memory device 67 do not need to be provided in the display device 60. Thus, the display device 60 can be small and the area of the display portion 61 can be large.

This embodiment can be implemented in an appropriate combination with the structures described in the other embodiments and the like.

Embodiment 2

In this embodiment, a structure example of the display device of one embodiment of the present invention will be described with reference to drawings.

Figure 14A:
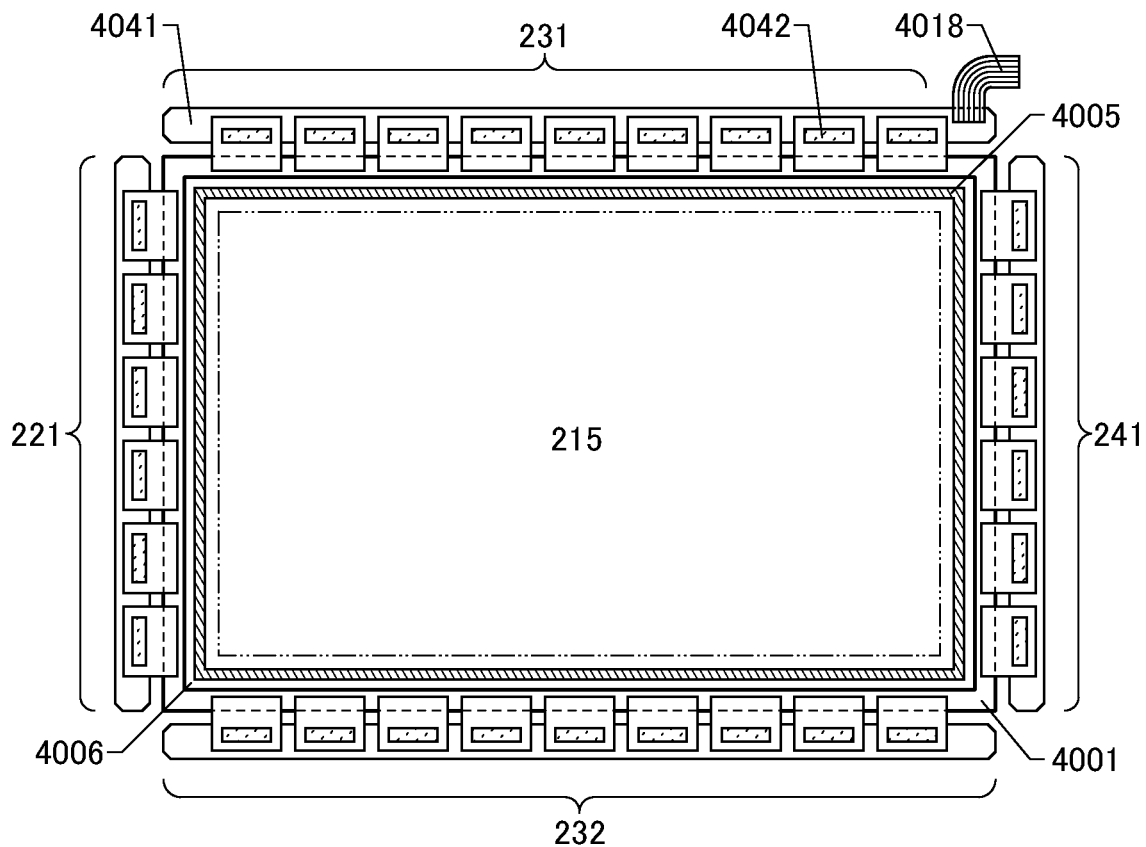
FIG. 14A and FIG. 14B are diagrams illustrating structure examples of a display device.

In FIG. 14A, a sealant 4005 is provided to surround a display portion 215 provided over a substrate 4001, and the display portion 215 is sealed with the sealant 4005 and a substrate 4006.

A display portion including the pixel described in Embodiment 1 is provided in the display portion 215.

In FIG. 14A, a gate driver circuit 221, a data driver circuit 231, a data driver circuit 232, and a power supply circuit 241 each include a plurality of integrated circuits 4042 provided over a printed board 4041. The integrated circuits 4042 are formed using a single crystal semiconductor or a polycrystalline semiconductor. The data driver circuit 231 and the data driver circuit 232 has a function of the data driver circuit described in Embodiment 1. The gate driver circuit 221 has a function of the gate driver circuit described in Embodiment 1. The power supply circuit 241 has a function of generating a prescribed potential to be supplied to the power supply line described in Embodiment 1.

Signals and potentials are supplied to the gate driver circuit 221, the power supply circuit 241, the data driver circuit 231, and the data driver circuit 232 through an FPC (Flexible printed circuit) 4018.

The integrated circuits 4042 included in the gate driver circuit 221 and the power supply circuit 241 have a function of generating a selection signal to be supplied to the display portion 215. The integrated circuits 4042 included in the data driver circuit 231 and the data driver circuit 232 have a function of generating image data to be supplied to the display portion 215. The integrated circuits 4042 are mounted in a region different from a region surrounded by the sealant 4005 over the substrate 4001.

Note that the connection method of the integrated circuits 4042 is not particularly limited, and a wire bonding method, a COG (Chip On Glass) method, a TCP (Tape Carrier Package) method, a COF (Chip On Film) method, or the like can be used.

Figure 14B:
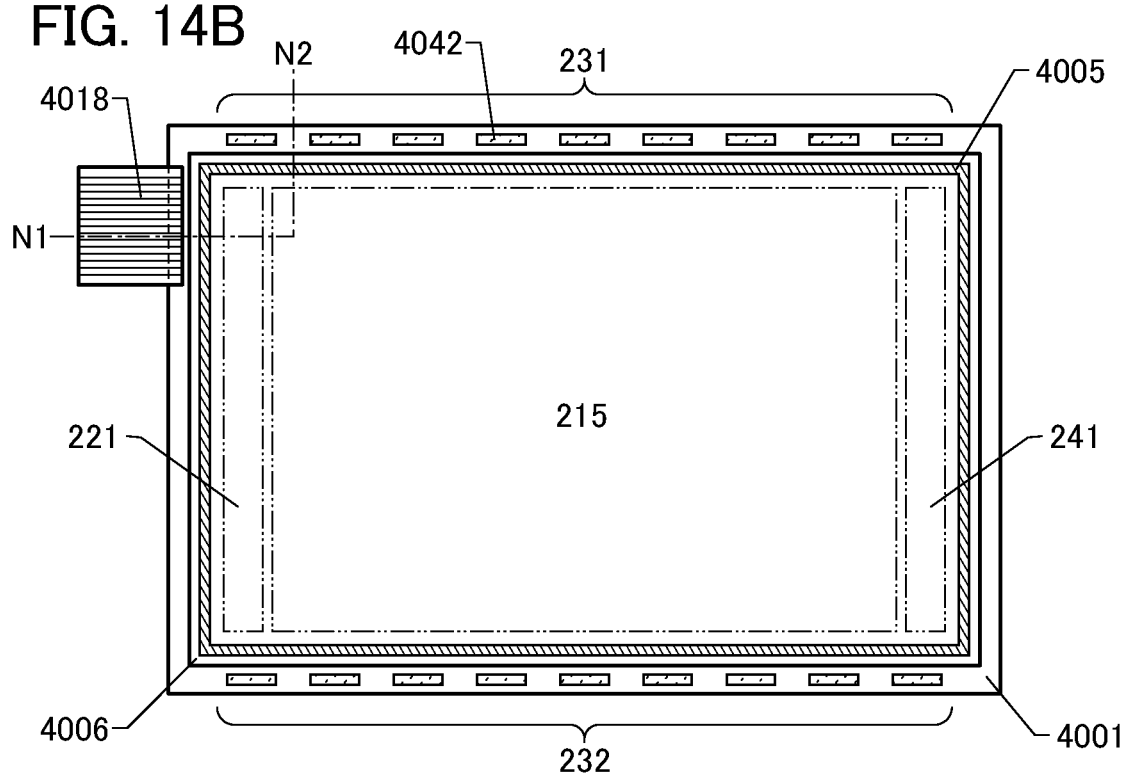

FIG. 14B illustrates an example of mounting the integrated circuits 4042 included in the data driver circuit 231 and the data driver circuit 232 by a COG method. Some or all of the driver circuits can be formed over the same substrate as the display portion 215, whereby a system-on-panel can be formed.

FIG. 14B illustrates an example of forming the gate driver circuit 221 and the power supply circuit 241 over the same substrate as the display portion 215. When the driver circuits are formed concurrently with pixel circuits in the display portion 215, the number of components can be reduced. Accordingly, the productivity can be increased.

In addition, in FIG. 14B, the sealant 4005 is provided to surround the display portion 215, the gate driver circuit 221, and the power supply circuit 241 that are provided over the substrate 4001. The substrate 4006 is provided over the display portion 215, the gate driver circuit 221, and the power supply circuit 241. Thus, the display portion 215, the gate driver circuit 221, and the power supply circuit 241 are sealed together with display elements by the substrate 4001, the sealant 4005, and the substrate 4006.

Although FIG. 14B illustrates an example in which the data driver circuit 231 and the data driver circuit 232 are formed separately and mounted on the substrate 4001, one embodiment of the present invention is not limited to this structure. The gate driver circuit may be formed separately and then mounted, or part of the data driver circuits or part of the gate driver circuit may be formed separately and then mounted.

In some cases, the display device encompasses a panel in which the display element is sealed, and a module in which an IC or the like including a controller is mounted on the panel.

The display portion and the gate driver circuit provided over the substrate include a plurality of transistors. As the transistor, a transistor described below can be used, for example.

Transistors included in a peripheral driver circuit and transistors included in the pixel circuits of the display portion may have the same structure or different structures. The transistors included in the peripheral driver circuit may have the same structure or a combination of two or more kinds of structures. Similarly, the transistors included in the pixel circuits may have the same structure or a combination of two or more kinds of structures.

An input device can be provided over the substrate 4006. The display devices illustrated in FIG. 14A and FIG. 14B provided with an input device can function as a touch panel. Note that the input device is not illustrated in FIG. 14A and FIG. 14B. A structure of the input device will be described later.

There is no limitation on a sensing element (also referred to as a sensor element) included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used as the sensor type.

In this embodiment, a touch panel including a capacitive sensor element is described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel of one embodiment of the present invention can have any of a variety of structures, including a structure in which a display device and a sensor element that are separately fabricated are attached to each other and a structure in which an electrode and the like included in a sensor element are provided on one or both of a substrate supporting a display element and a counter substrate.

Figure 15A:
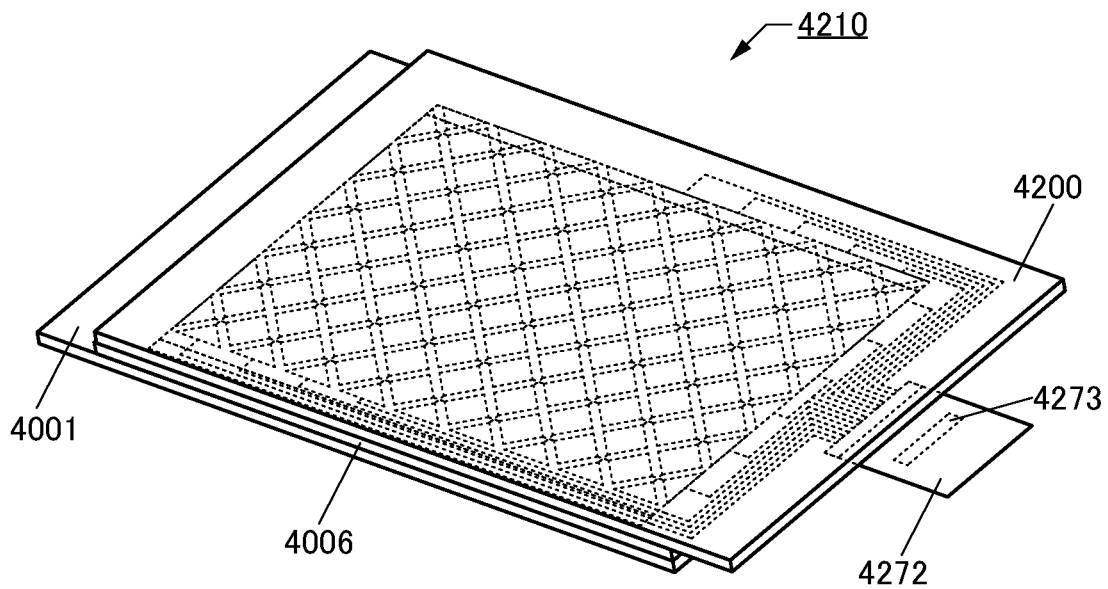
FIG. 15A and FIG. 15B are diagrams illustrating structure examples of a touch panel.
Figure 15B:
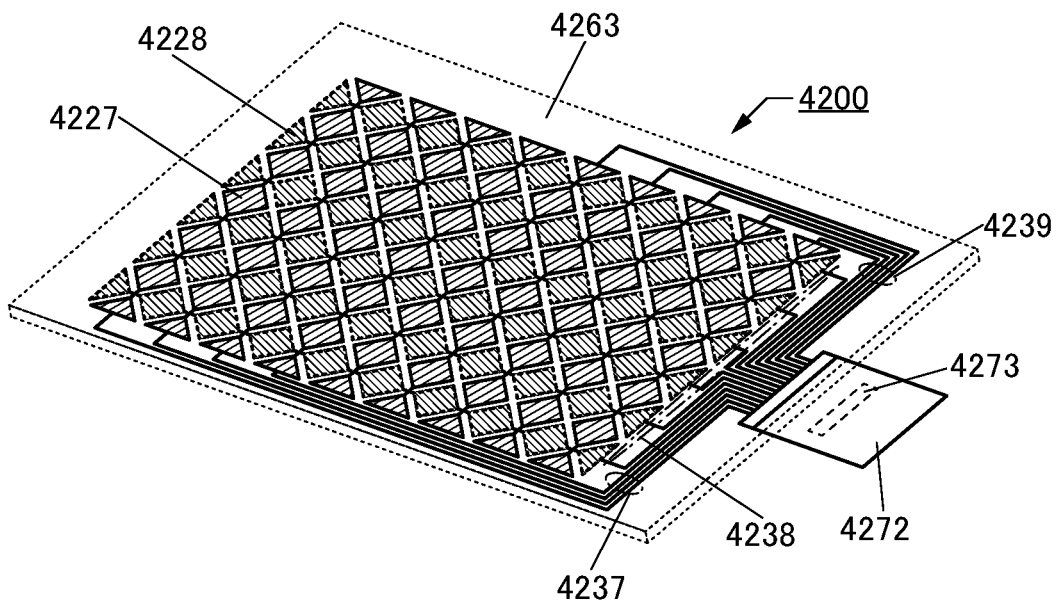

FIG. 15A and FIG. 15B illustrate an example of a touch panel. FIG. 15A is a perspective view of a touch panel 4210. FIG. 15B is a schematic perspective view of an input device 4200. Note that for clarity, only typical components are illustrated.

The touch panel 4210 has a structure in which a display device and a sensor element that are separately fabricated are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4238. An FPC 4272 is electrically connected to each of the plurality of wirings 4237, the plurality of wirings 4238, and the plurality of wirings 4239. An IC 4273 can be provided for the FPC 4272.

Alternatively, a touch sensor may be provided between the substrate 4001 and the substrate 4006 in the display device. In the case where a touch sensor is provided between the substrate 4001 and the substrate 4006, an optical touch sensor using a photoelectric conversion element may be used other than a capacitive touch sensor.

<Example 1 of Cross-Sectional Structure of Display Device>

FIG. 16A is a cross-sectional view of a portion indicated by a chain line N1-N2 in FIG. 14B and illustrates a structure example of a light-emitting display device employing a color filter method and having a top-emission structure. A display device illustrated in FIG. 16A includes an electrode 4015, and the electrode 4015 is electrically connected to a terminal included in an FPC 4018 through an anisotropic conductive layer 4019. In FIG. 16A, the electrode 4015 is electrically connected to a wiring 4014 in an opening formed in an insulating layer 4112, an insulating layer 4111, and an insulating layer 4110.

The electrode 4015 is formed of the same conductive layer as an electrode layer 4030, and the wiring 4014 is formed of the same conductive layer as source electrodes and drain electrodes of a transistor 4010 and a transistor 4011.

The display portion 215 and the gate driver circuit 221 provided over the substrate 4001 include a plurality of transistors, and the transistor 4010 included in the display portion 215 and the transistor 4011 included in the gate driver circuit 221 are illustrated as an example in FIG. 16A. Note that in the example illustrated in FIG. 16A, the transistor 4010 and the transistor 4011 are bottom-gate transistors but may be top-gate transistors.

In FIG. 16A, the insulating layer 4112 is provided over the transistor 4010 and the transistor 4011. A partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display device illustrated in FIG. 16A includes a capacitor 4020. The capacitor 4020 includes an electrode 4021 formed in the same step as a gate electrode of the transistor 4010 and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be retained for a predetermined period. The capacitance of the capacitor may be set in consideration of the off-state current of the transistors or the like.

The transistor 4010 provided in the display portion 215 is electrically connected to the display element.

In the display device illustrated in FIG. 16A, insulating layers through which an impurity element does not easily pass are used as the insulating layer 4111 and the insulating layer 4103. A semiconductor layer of the transistor is interposed between the insulating layer 4111 and the insulating layer 4103, whereby entry of impurities from the outside can be prevented.

As the display element included in the display device, a light-emitting element utilizing electroluminescence (EL element) can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and the light-emitting substance contained in the EL layer emits light.

EL elements are classified depending on whether a light-emitting material is an organic compound or an inorganic compound; in general, the former is referred to as an organic EL element, and the latter is referred to as an inorganic EL element.

In an organic EL element, by voltage application, electrons are injected from one electrode to the EL layer and holes are injected from the other electrode to the EL layer.

Then, the carriers (electrons and holes) are recombined, and thus a light-emitting organic compound forms an excited state, and light is emitted when the excited state returns to a ground state. Owing to such a mechanism, this light-emitting element is referred to as a current-excitation light-emitting element.

In addition to the light-emitting compound, the EL layer may further contain any of a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), or the like.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is interposed between dielectric layers, which are further interposed between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 16A illustrates an example of a light-emitting display device using a light-emitting element as a display element (also referred to as an "EL display device"). A light-emitting element 4513 that is a display element is electrically connected to the transistor 4010 provided in the display portion 215. The light-emitting element 4513 can be an element that emits white light. Note that the structure of the light-emitting element 4513 is a stacked-layer structure of the electrode layer 4030, a light-emitting layer 4511, and an electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. It is particularly preferable that a photosensitive resin material be used, and an opening portion be formed over the electrode layer 4030 such that a side surface of the opening portion is formed to be an inclined surface having continuous curvature.

The light-emitting layer 4511 may be formed using a single layer or a plurality of layers stacked.

Note that the light-emitting layer 4511 may contain an inorganic compound such as quantum dots (QD). For example, when used for the light-emitting layer, the quantum dots can function as a light-emitting material.

A quantum dot is a semiconductor nanocrystal with a size of several nanometers to several tens of nanometers and contains approximately $1\times10^3$ to $1\times10^6$ atoms. Since energy shift of quantum dots depends on their size, quantum dots made of the same substance emit light with different emission wavelengths depending on their size. Thus, emission wavelengths can be easily changed by varying the size of quantum dots to be used.

Since a quantum dot has an emission spectrum with a narrow peak width, light emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, the use of a quantum dot as a light-emitting material enables a light-emitting element having high emission efficiency to be obtained. Furthermore, since a quantum dot, which is an inorganic material, has high inherent stability, a light-emitting element that is favorable also in terms of a lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide;

indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof What is called an alloyed quantum dot whose composition is represented by a given ratio may be used. For example, an alloyed quantum dot of cadmium, selenium, and sulfur is a means effective in obtaining blue light emission because the emission wavelength can be changed by varying the content ratio of the elements.

As the quantum dot structure, there are a core type, a core-shell type, a core-multishell type, and the like, and any of them may be used. When a core is covered with a shell formed of another inorganic material having a wider band gap, the influence of a defect or a dangling bond existing at the surface of a nanocrystal can be reduced. Since this can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily aggregate together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl) amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridine, lutidine, collidine, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size becomes smaller; thus, the emission wavelengths of the quantum dots can be adjusted over a wavelength range of a spectrum of an ultraviolet region, a visible light region, and an infrared region by changing the size of quantum dots. The range of size (diameter) of quantum dots which is usually used is greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods which are rod-like shape quantum dots have a function of emitting directional light; thus, quantum rods can be used as a light-emitting material to obtain a light-emitting element with higher external quantum efficiency.

In most organic EL elements, to improve emission efficiency, concentration quenching of the light-emitting materials is inhibited by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials that have triplet excitation energy levels higher than or equal to those of the blue phosphorescent materials and are excellent in terms of a lifetime. Even when a light-emitting layer is composed of quantum dots and made without a host material, the quantum dots enable emission efficiency to be ensured; thus, a light-emitting element that is favorable in terms of a lifetime can be obtained. In the case where the light-emitting layer is composed of quantum dots, the quantum dots preferably have core-shell structures (including core-multishell structures).

In the case of using quantum dots as the light-emitting material in the light-emitting layer, the thickness of the light-emitting layer is set to be greater than or equal to 3 nm and less than or equal to 100 nm, preferably greater than or equal to 10 nm and less than or equal to 100 nm, and the quantum dot content of the light-emitting layer is greater than or equal to 1 and less than or equal to 100 volume %. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, a blade coating method, a roll coating method, an inkjet method, a printing method, a spray coating method, a curtain coating method, or a Langmuir-Blodgett method) may be employed. For a light-emitting layer using a phosphorescent light-emitting material, a vacuum evaporation method, as well as the above wet process, can be suitably employed.

As the liquid medium used for the wet process, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

A protective layer may be formed over the electrode layer 4031 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In a space that is sealed by the substrate 4001, the substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy resin, a silicone resin, PVB (polyvinyl butyral), EVA (ethylene vinyl acetate), or the like can be used. A drying agent may be contained in the filler 4514.

A glass material such as a glass frit or a resin material such as a resin that is curable at room temperature, e.g., a two-component-mixture-type resin, a light curable resin, or a thermosetting resin can be used for the sealant 4005. A drying agent may be contained in the sealant 4005.

The display device illustrated in FIG. 16A includes a coloring layer 4301 and a light-blocking layer 4302. The coloring layer 4301 includes a region overlapping with the light-emitting element 4513 with the filler 4514 therebetween, and the light-blocking layer 4302 includes a region overlapping with the partition wall 4510 with the filler 4514 therebetween.

The coloring layer 4301 is a colored layer that transmits light in a specific wavelength range. For example, a color filter that transmits red, green, blue, cyan, magenta, or yellow light can be used. Examples of a material that can be used for the coloring layer 4301 include a metal material, a resin material, and a resin material containing pigment or dye.

The coloring layer 4301 is provided between the adjacent light-blocking layers 4302. The light-blocking layer 4302 has a function of blocking light emitted from the light-emitting element 4513 and inhibiting color mixture between the adjacent light-emitting elements 4513. Here, the coloring layer 4301 is provided such that its end portion overlaps with the light-blocking layer 4302, whereby light leakage can be inhibited. As the light-blocking layer 4302, a material that blocks light emitted from the light-emitting element 4513 can be used; for example, a black matrix can be formed using a metal material, a resin material containing pigment or dye, or the like.

If needed, a polarizing plate, a circularly polarizing plate (including an elliptically polarizing plate), or a retardation plate (a quarter-wave plate or a half-wave plate) may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted.

Light-transmitting properties or light-reflecting properties of the electrode layer 4030 and the electrode layer 4031 can be selected depending on the direction in which light is extracted, the position where the electrode layers are provided, and the pattern structure of the electrode layers.

For the electrode layer 4030 and the electrode layer 4031, a light-transmitting conductive material such as an indium oxide containing tungsten oxide, an indium zinc oxide containing tungsten oxide, an indium oxide containing titanium oxide, an indium tin oxide, an indium tin oxide containing titanium oxide, an indium zinc oxide, or an indium tin oxide to which silicon oxide is added can be used.

The electrode layer 4030 and the electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and metal nitrides thereof The electrode layer 4030 and the electrode layer 4031 can be formed using a conductive composition containing a conductive high molecule (also referred to as a conductive polymer). As the conductive high molecule, what is called a π-electron conjugated conductive high molecule can be used. For example, polyaniline or a derivative thereof, polypyrrole or a derivative thereof, polythiophene or a derivative thereof, or a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

As illustrated in FIG. 16A, by employing the color filter method in which the light-emitting element 4513 whose emission color is white and the coloring layer are combined, the productivity of the display device of one embodiment of the present invention can be increased.

FIG. 16B is a cross-sectional view of the portion indicated by the chain line N1-N2 in FIG. 14B, and is different from the display device with the structure illustrated in FIG. 16A in that no color filter is included and a separate coloring method is employed. In the display device employing the separate coloring method, the emission color of the light-emitting element 4513 can be white, red, green, blue, cyan, magenta, yellow, or the like depending on the material forming the light-emitting layer 4511.

When the separate coloring method is employed as illustrated in FIG. 16B, light with high color purity can be extracted. Note that when the display device employing the separate coloring method is provided with a color filter, light with higher color purity can be extracted.

Note that a color conversion method, a quantum dot method, or the like may be employed in the display device of one embodiment of the present invention.

<Example 2 of Cross-Sectional Structure of Display Device>

Figure 17:
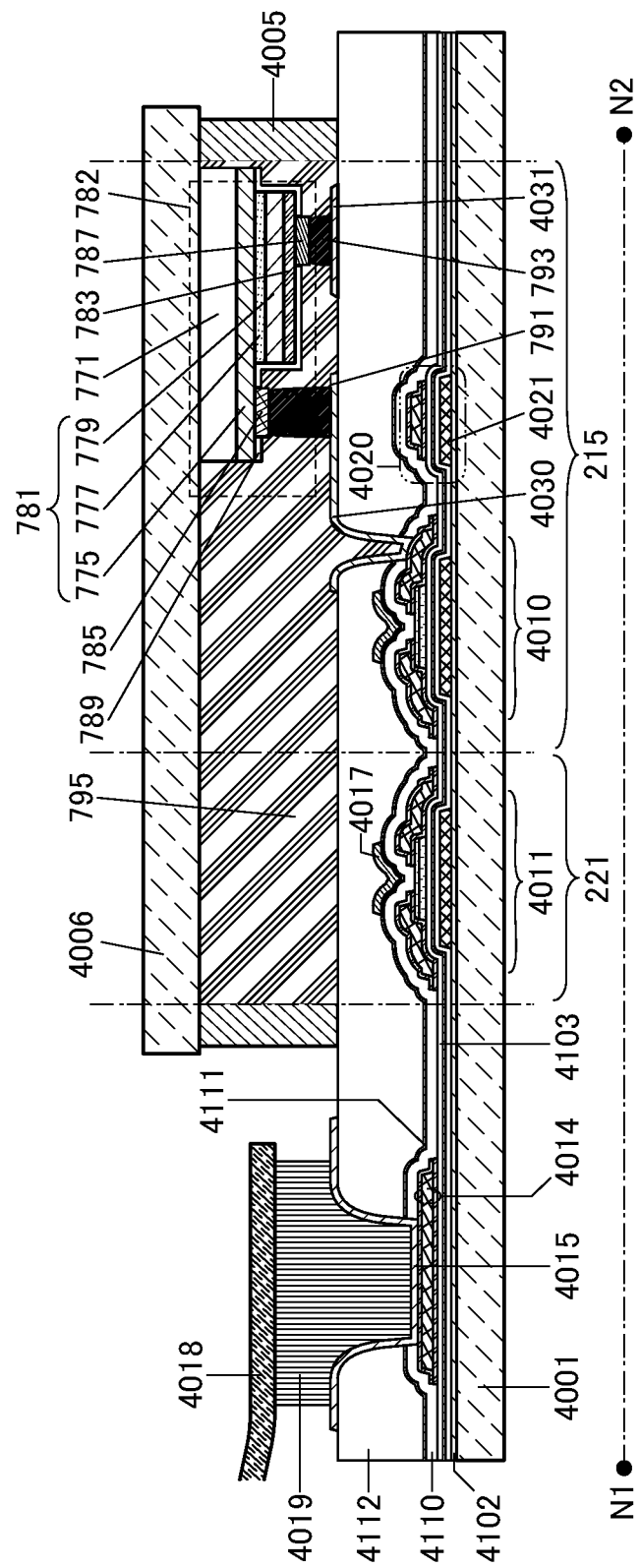
FIG. 17 is a diagram illustrating a structure example of a display device.

FIG. 17 is a cross-sectional view of the portion indicated by the chain line N1-N2 in FIG. 14B, and illustrates a structure example of a display device using an LED, particularly, a micro LED that is a light-emitting element as a display element. Note that components similar to those of the display device illustrated in FIG. 16A and the like are omitted in FIG. 17 and the like.

In the display device with the structure illustrated in FIG. 17, the electrode layer 4031 is provided in the same layer as the electrode layer 4030. In addition, a display element 782 is provided over the insulating layer 4112. The display element 782 is electrically connected to the electrode layer 4030 through a bump 791 and is electrically connected to the electrode layer 4031 through a bump 793.

In a space that is sealed by the substrate 4001, the substrate 4006, and the sealant 4005, a light-blocking layer 795 is provided. The light-blocking layer 795 is preferably provided between the adjacent display elements 782. When the light-blocking layer 795 is provided between the adjacent display elements 782, light leakage to an adjacent pixel and color mixture between pixels can be inhibited. A resin containing pigment, dye, carbon black, or the like can be used for the light-blocking layer 795. Furthermore, a side surface of the display element 782 is preferably in contact with the light-blocking layer 795. When the side surface of the display element 782 is covered with the light-blocking layer 795, light leakage to an adjacent pixel and color mixture between pixels can be inhibited. Note that although FIG. 17 illustrates a structure in which the level of a top surface of the light-blocking layer 795 is substantially the same as the level of a top surface of the display element 782, one embodiment of the present invention is not limited thereto. The level of the top surface of the light-blocking layer 795 may be lower than the level of the top surface of the display element 782 or higher than the level of the top surface of the display element 782. When the level of the top surface of the light-blocking layer 795 is substantially the same as or higher than the level of the top surface of the display element 782, light leakage to an adjacent pixel and color mixture between pixels can be inhibited efficiently.

The display element 782 includes a semiconductor layer 781 over a substrate 771. The semiconductor layer 781 includes an n-type semiconductor layer 775, a light-emitting layer 777 over the n-type semiconductor layer 775, and a p-type semiconductor layer 779 over the light-emitting layer 777. As a material for the p-type semiconductor layer 779, a material that has a larger band gap energy than the light-emitting layer 777 and can allow carriers to be trapped in the light-emitting layer 777 can be used.

In addition, in the display element 782, an electrode layer 785 having a function of a cathode is provided over the n-type semiconductor layer 775, an electrode layer 783 having a function of a contact electrode is provided over the p-type semiconductor layer 779, and an electrode layer 787 having a function of an anode is provided over the electrode layer 783. Furthermore, a top surface and side surfaces of the electrode layer 783 are preferably covered with an insulating layer 789. The insulating layer 789 has a function of a protective film of the display element 782.

Note that the n-type semiconductor layer 775 may be a p-type semiconductor layer, and the p-type semiconductor layer 779 may be an n-type semiconductor layer. In this case, the electrode layer 785 can have a function of an anode, and the electrode layer 787 can have a function of a cathode.

The bump 791 is provided between the electrode layer 785 and the electrode layer 4030, whereby the electrode layer 785 is electrically connected to the electrode layer 4030. In addition, the bump 793 is provided between the electrode layer 787 and the electrode layer 4031, whereby the electrode layer 787 is electrically connected to the electrode layer 4031. Note that FIG. 17 illustrates a structure in which the level of a position where the electrode layer 785 is provided and the level of a position where the electrode layer 787 is provided are different, and accordingly, the level of the bump 791 and the level of the bump 793 are different. In the case where the level of the position where the electrode layer 785 is provided and the level of the position where the electrode layer 787 is provided are the same, the level of the bump 791 and the level of the bump 793 can be substantially the same.

The display element 782 can be an LED. In this case, the area of a light-emitting region can be 1 mm² or less, preferably 10000 µm² or less, further preferably 3000 µm² or less, and still further preferably 700 µm² or less. When the area of the light-emitting region is small, the power consumption of the display device of one embodiment of the present invention can be reduced. In addition, the display device of one embodiment of the present invention can be thinner and more lightweight. Moreover, the display device of one embodiment of the present invention can have high contrast and a wide viewing angle; thus, a high-quality image can be displayed.

Figure 18:
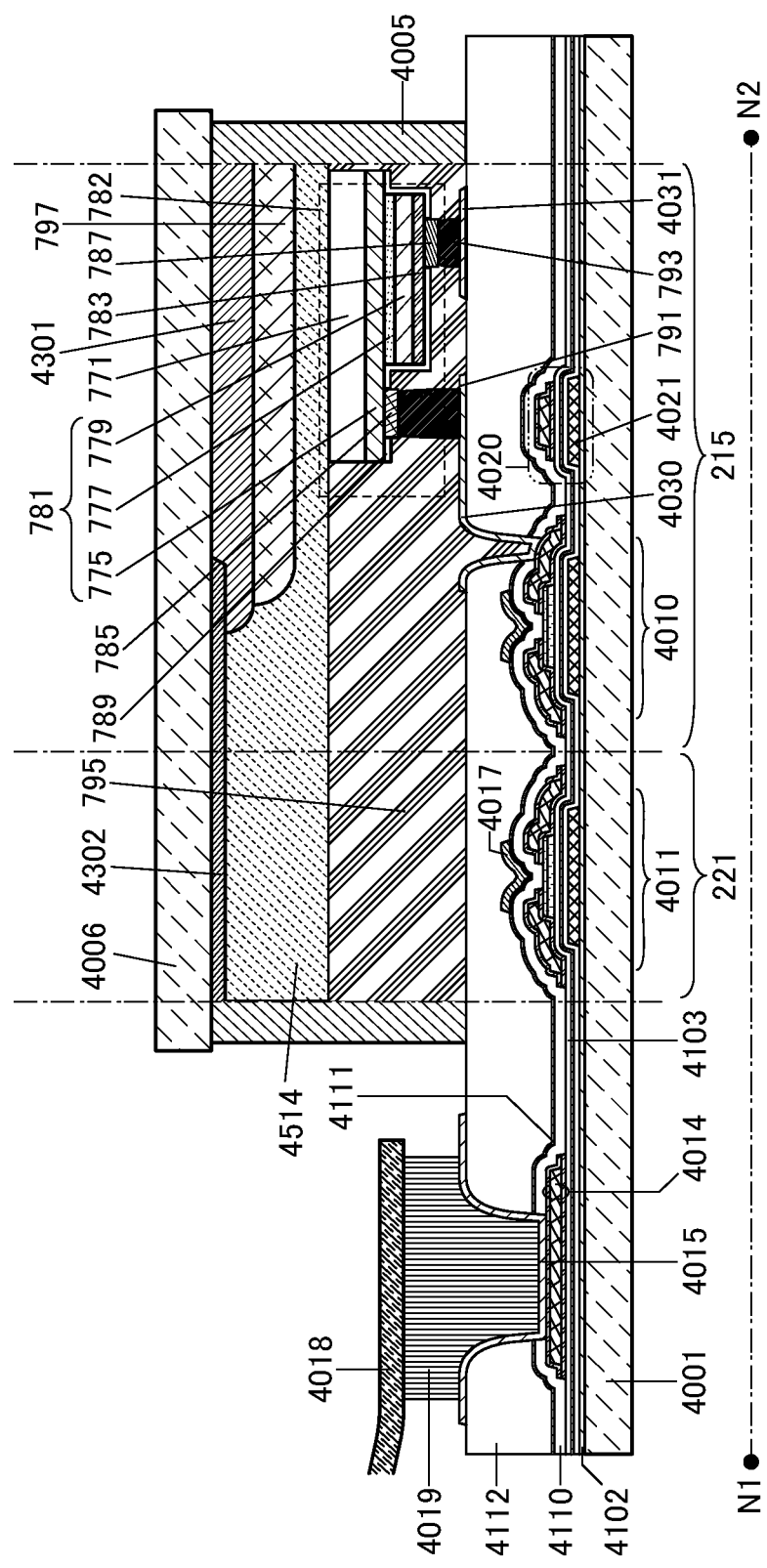
FIG. 18 is a diagram illustrating a structure example of a display device.

FIG. 18 is a modification example of the display device with the structure illustrated in FIG. 17, and is different from the display device with the structure illustrated in FIG. 17 in that the coloring layer 4301, the light-blocking layer 4302, and a phosphor layer 797 are provided between the substrate 4006 and the display element 782 and the light-blocking layer 795.

The coloring layer 4301 includes a region overlapping with the display element 782. The light-blocking layer 4302 is provided such that an end portion of the light-blocking layer 4302 overlaps with an end portion of the coloring layer 4301. In addition, the phosphor layer 797 is provided over the coloring layer 4301.

Accordingly, the phosphor layer 797, the display element 782, and the coloring layer 4301 include a region in which they overlap with one another. It is preferable that, as illustrated in FIG. 18, an end portion of the phosphor layer 797 be positioned on the outer side than an end portion of the display element 782 and the end portion of the coloring layer 4301 be positioned on the outer side than the end portion of the phosphor layer 797. With such a structure, light leakage to an adjacent pixel and color mixture between pixels can be inhibited.

The filler 4514 is provided between the coloring layer 4301, the light-blocking layer 4302, and the phosphor layer 797 and the display element 782 and the light-blocking layer 795.

For example, when the phosphor layer 797 includes a phosphor emitting yellow light and the display element 782 emits blue light, white light is emitted from the phosphor layer 797. Here, when the coloring layer 4301 is a coloring layer transmitting red light, light emitted from the display element 782 passes through the phosphor layer 797 and a coloring layer 736 and is emitted to the display surface side as red light. Similarly, when the coloring layer 4301 is a coloring layer transmitting green light, light emitted from the display element 782 passes through the phosphor layer 797 and the coloring layer 736 and is emitted to the display surface side as green light. Furthermore, when the coloring layer 4301 is a coloring layer transmitting blue light, light emitted from the display element 782 passes through the phosphor layer 797 and the coloring layer 736 and is emitted to the display surface side as blue light. Thus, color display can be performed using one type of display element 782. Since one type of the display element 782 is used in the display device, the display device of one embodiment of the present invention can be fabricated by a simple method; thus the display device of one embodiment of the present invention can be inexpensive.

Note that for example, when the phosphor layer 797 includes a phosphor emitting red light and the display element 782 emits blue-green light, a structure in which white light is emitted from the phosphor layer 797 may be obtained. Alternatively, when the phosphor layer 797 includes a phosphor emitting red light, a phosphor emitting green light, and a phosphor emitting blue light and the display element 782 emits near-ultraviolet light or violet light, a structure in which white light is emitted from the phosphor layer 797 may be obtained.

This embodiment can be implemented in an appropriate combination with the structures described in the other embodiments and the like.

Embodiment 3

In this embodiment, examples of transistors that can be used as substitutes of the transistors described in the above embodiments will be described with reference to drawings.

The display device of one embodiment of the present invention can be fabricated using a transistor with any of various structures, such as a bottom-gate transistor and a top-gate transistor. Therefore, a material for a semiconductor layer or the structure of a transistor to be used can be easily substituted according to the existing production line.

[Bottom-Gate Transistor]

FIG. 19A1 is a cross-sectional view of a channel-protective transistor 810 that is a type of bottom-gate transistor. In FIG. 19A1, the transistor 810 is formed over the substrate 771. The transistor 810 includes an electrode 746 over the substrate 771 with an insulating layer 772 therebetween. The transistor 810 includes a semiconductor layer 742 over the electrode 746 with an insulating layer 726 therebetween. The electrode 746 has a function of a gate electrode. The insulating layer 726 has a function of a gate insulating layer.

Furthermore, an insulating layer 741 is included over a channel formation region in the semiconductor layer 742. Furthermore, an electrode 744a and an electrode 744b are included over the insulating layer 726 to be partly in contact with the semiconductor layer 742. The electrode 744a has a function of one of a source electrode or a drain electrode. The electrode 744b has a function of the other of the source electrode or the drain electrode. Part of the electrode 744a and part of the electrode 744b are formed over the insulating layer 741.

The insulating layer 741 has a function of a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741, and includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. The carrier concentration in the regions of the semiconductor layer 742 where oxygen vacancies are generated is increased, and the regions become n-type regions (n+layers). Accordingly, the regions can function as a source region or a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and the electrode 744a and the electrode 744b. Accordingly, the electrical characteristics of the transistor, such as the field-effect mobility and the threshold voltage, can become favorable.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region of the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 19A2 is different from the transistor 810 in that an electrode 723 that has a function of a back gate electrode is included over the insulating layer 729. The electrode 723 can be formed using a material and a method similar to those of the electrode 746.

In general, a back gate electrode is formed using a conductive layer and positioned so that a channel formation region of a semiconductor layer is interposed between a gate electrode and the back gate electrode. Thus, the back gate electrode can function in a manner similar to the gate electrode. The potential of the back gate electrode may be the same as that of the gate electrode, a ground potential (GND potential), or any given potential. By changing the potential of the back gate electrode without synchronization and independently of the potential of the gate electrode, the threshold voltage of the transistor can be changed.

The electrode 746 and the electrode 723 can both function as a gate electrode. Thus, the insulating layer 726, the insulating layer 741, the insulating layer 728, and the insulating layer 729 can each function as a gate insulating layer. The electrode 723 may be provided between the insulating layer 728 and the insulating layer 729.

In the case where one of the electrode 746 or the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 might be referred to as a "first gate electrode", and the other might be referred to as a "second gate electrode".

By providing the electrode 746 and the electrode 723 with the semiconductor layer 742 interposed therebetween and setting the potentials of the electrode 746 and the electrode 723 to the same potential, a region of the semiconductor layer 742 through which carriers flow is enlarged in the film thickness direction; thus, the amount of carrier transfer is increased. As a result, the on-state current of the transistor 811 is increased and the field-effect mobility of the transistor 811 is increased.

Therefore, the transistor 811 has a high on-state current with respect to its occupied area. That is, the area occupied by transistor 811 can be reduced for a required on-state current. According to one embodiment of the present invention, the area occupied by a transistor can be small.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a highly reliable transistor can be achieved. In addition, a highly reliable display device and the like can be achieved.

FIG. 19B1 is a cross-sectional view of a channel-protective transistor 820 that is a type of bottom-gate transistor. The transistor 820 has substantially the same structure as the transistor 810 but is different in that the insulating layer 741 covers end portions of the semiconductor layer 742. In addition, the semiconductor layer 742 is electrically connected to the electrode 744a in an opening portion formed by selectively removing part of the insulating layer 741 that overlaps with the semiconductor layer 742. Furthermore, the semiconductor layer 742 is electrically connected to the electrode 744b in another opening portion formed by selectively removing part of the insulating layer 741 that overlaps with the semiconductor layer 742. A region of the insulating layer 741 that overlaps with the channel formation region has a function of a channel protective layer.

A transistor 821 illustrated in FIG. 19B2 is different from the transistor 820 in that the electrode 723 that has a function of a back gate electrode is included over the insulating layer 729.

By providing the insulating layer 729, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 in the transistor 820 and the transistor 821 are greater than those in the transistor 810 and the transistor 811. Thus, parasitic capacitance generated between the electrode 744a and the electrode 746 can be reduced. Moreover, parasitic capacitance generated between the electrode 744b and the electrode 746 can be reduced. According to one embodiment of the present invention, a transistor with favorable electrical characteristics can be achieved.

A transistor 825 illustrated in FIG. 19C1 is a channel-etched transistor that is a type of bottom-gate transistor. In the transistor 825, the electrode 744a and the electrode 744b are formed without using the insulating layer 741. Thus, part of the semiconductor layer 742 that is exposed at the time of forming the electrode 744a and the electrode 744b is etched in some cases. However, since the insulating layer 741 is not provided, the productivity of the transistor can be increased.

A transistor 826 illustrated in FIG. 19C2 is different from the transistor 825 in that the electrode 723 that has a function of a back gate electrode is included over the insulating layer 729.

[Top-Gate Transistor]

A transistor 842 illustrated in FIG. 20A1 is a type of top-gate transistor. In the transistor 842, the electrode 744a and the electrode 744b are formed after the insulating layer 729 is formed.

The electrode 744a and the electrode 744b are electrically connected to the semiconductor layer 742 in openings formed in the insulating layer 728 and the insulating layer 729.

Furthermore, as illustrated in FIG. 20A3, part of the insulating layer 726 that does not overlap with the electrode 746 is removed, and an impurity 755 is introduced into the semiconductor layer 742 using the electrode 746 and the residual insulating layer 726 after the removal as masks, so that an impurity region can be formed in the semiconductor layer 742 in a self-aligned manner. The transistor 842 includes a region where the insulating layer 726 extends beyond end portions of the electrode 746. The semiconductor layer 742 in a region where the impurity 755 is introduced through the insulating layer 726 has a lower impurity concentration than a region where the impurity 755 is introduced without through the insulating layer 726. Thus, an LDD (Lightly Doped Drain) region is formed in a region of the semiconductor layer 742 that does not overlap with the electrode 746.

A transistor 843 illustrated in FIG. 20A2 is different from the transistor 842 in that the electrode 723 is included. The transistor 843 includes the electrode 723 formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 20B1 and a transistor 845 illustrated in FIG. 20B2, the insulating layer 726 in a region that does not overlap with the electrode 746 may be completely removed. In addition, as in a transistor 846 illustrated in FIG. 20C1 and a transistor 847 illustrated in FIG. 20C2, the insulating layer 726 may be left behind.

Also in the transistor 843 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be achieved.

This embodiment can be implemented in an appropriate combination with the structures described in the other embodiments and the like.

Embodiment 4

In this embodiment, the composition of a CAC-OS that can be used for the transistor disclosed in one embodiment of the present invention will be described.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) to form a mosaic pattern, and $InO_{X1}$ or $In_{X2}Zn_{Y2}O_{Z2}$ forming the mosaic pattern is evenly distributed in the film.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1+x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that in the CAC-OS, a layered structure including two or more films with different compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated intentionally, for example. In the case where the CAC-OS is formed by a sputtering method, one or more selected from an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found by the X-ray diffraction measurement that there are no alignment in the a-b plane direction and the c-axis direction in the measured areas.

In the CAC-OS, an electron diffraction pattern that is obtained by irradiation with an electron beam with a probe diameter of 1 nm (also referred to as nanobeam electron beam) has a region with high luminance in a ring pattern (a ring region) and a plurality of bright spots observed in the ring region. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions containing $GaO_{X3}$ as a main component and regions containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through regions containing $In_{X2}Zn_{Y2}O_{Z2}$ or $InO_{X1}$ as a main component, the conductivity of an oxide semiconductor is generated. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

In contrast, a region containing $GaO_{X3}$ or the like as a main component is a region whose insulating property is higher than that of a region containing $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is most suitable for a variety of semiconductor devices typified by a display.

This embodiment can be implemented in an appropriate combination with the structures described in the other embodiments and the like.

Embodiment 5

In this embodiment, an electronic device in which the display device of one embodiment of the present invention can be used will be described with reference to drawings.

Examples of an electronic device in which the display device of one embodiment of the present invention can be used include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 21 illustrates specific examples of these electronic devices.

Figure 21A:
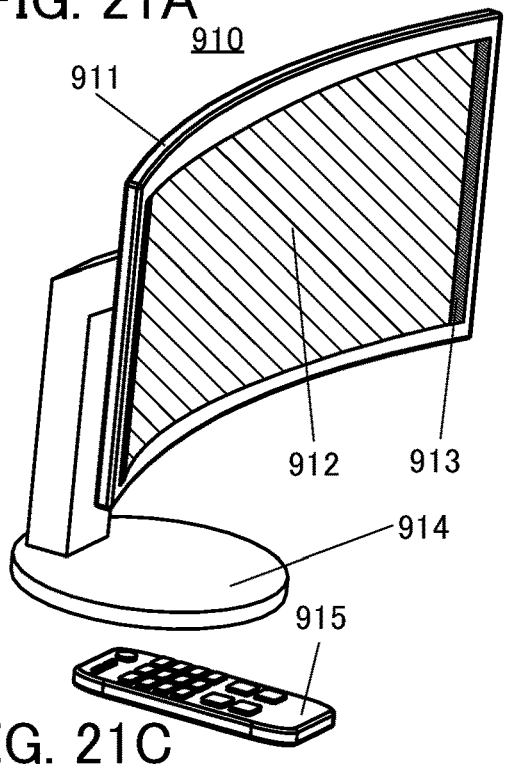
FIG. 21A, FIG. 21B, FIG. 21C, FIG. 21D, FIG. 21E, and FIG. 21F are diagrams illustrating examples of electronic devices.

FIG. 21A is an example of a television device 910 that includes a housing 911, a display portion 912, a speaker 913, and the like. FIG. 21A illustrates a structure in which the housing 911 is supported by a stand 914.

The television device 910 can be operated by a switch provided on the housing 911 and a separate remote controller 915. Alternatively, the display portion 912 may be provided with a touch sensor, and the television device 910 may be operated by a touch on the display portion 912 with a finger or the like. The remote controller 915 may include a display portion for displaying data output from the remote controller 915. With operation keys or a touch panel provided in the remote controller 915, channels and volume can be operated and images displayed on the display portion 912 can be operated.

Note that the television device 910 can have a structure in which a receiver, a modem, and the like are included. A general television broadcast can be received with the receiver. When the television device is connected to a communication network with or without wires via the modem, one-way (from a transmitter to a receiver) or two-way (between a transmitter and a receiver or between receivers, for example) data communication can be performed.

In the television device 910, the display device of one embodiment of the present invention can be used for the display portion 912. Thus, a high-quality image can be displayed on the display portion 912.

Figure 21B:
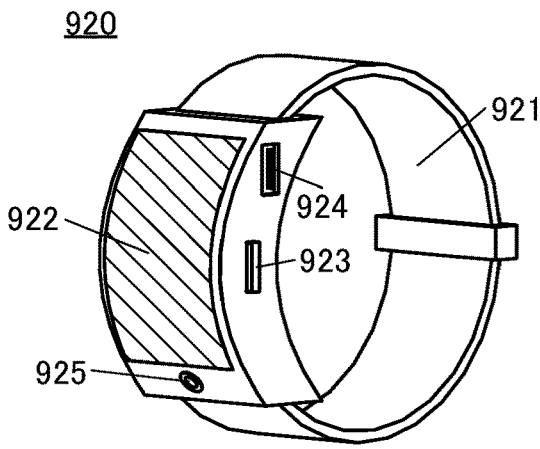

FIG. 21B is an example of a watch-type information terminal 920 that includes a housing and wristband 921, a display portion 922, an operation button 923, an external connection port 924, a camera 925, and the like. The display portion 922 is provided with a touch panel for operating the information terminal 920. The housing and wristband 921 and the display portion 922 have flexibility and fit a body well.

In the information terminal 920, the display device of one embodiment of the present invention can be used for the display portion 922. Thus, a high-quality image can be displayed on the display portion 922.

Figure 21C:
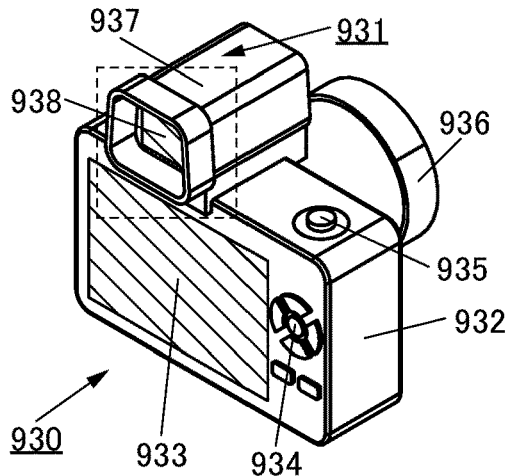

FIG. 21C is an example of a digital camera 930, and a finder 931 is attached. The digital camera 930 includes a housing 932, a display portion 933, operation buttons 934, and a shutter button 935, and the like. Furthermore, a detachable lens 936 is attached to the digital camera 930. Note that the lens 936 is not necessarily detachable.

The digital camera 930 can perform imaging at the press of the shutter button 935. In addition, the display portion 933 can have a function of a touch panel. In this case, taking images at the touch of the display portion 933 is also possible.

The housing 932 includes a mount including an electrode, so that a stroboscope or the like in addition to the finder 931 can be connected to the housing.

The finder 931 includes a housing 937, a display portion 938, and the like.

The housing 937 includes a mount engaging with the mount of the digital camera 930 and the finder 931 can be attached to the digital camera 930. The mount includes an electrode, and an image and the like corresponding to image data supplied from the digital camera 930 through the electrode can be displayed on the display portion 938.

The display device of one embodiment of the present invention can be used for the display portion 933 of the digital camera 930 and the display portion 938 of the finder 931. Thus, a high-quality image can be displayed on the display portion 933 and the display portion 938.

Figure 21D:
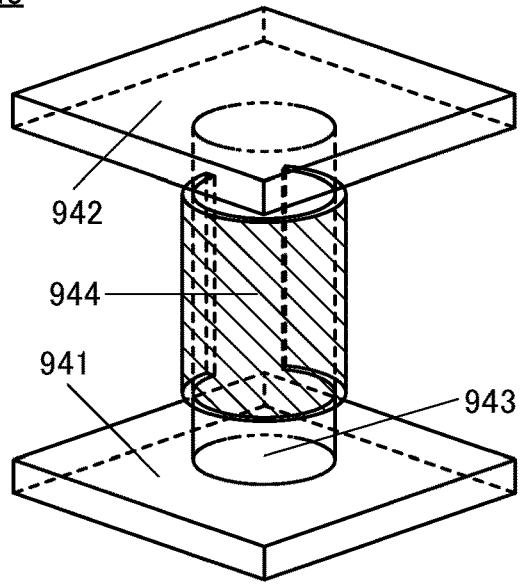

FIG. 21D is an example of a digital signage 940. A pillar 943 is provided between a floor 941 and a ceiling 942, and a display portion 944 is attached along a curved surface of the pillar 943.

The larger display portion 944 can increase the amount of information that can be provided at a time. In addition, the larger display portion 944 attracts more attention, so that the effectiveness of the advertisement can be increased, for example.

It is preferable to use a touch panel in the display portion 944 because not only an image is displayed on the display portion 944 but also users can operate intuitively.

In the digital signage 940, the display device of one embodiment of the present invention can be used for the display portion 944. Thus, a high-quality image can be displayed on the display portion 944.

Figure 21E:
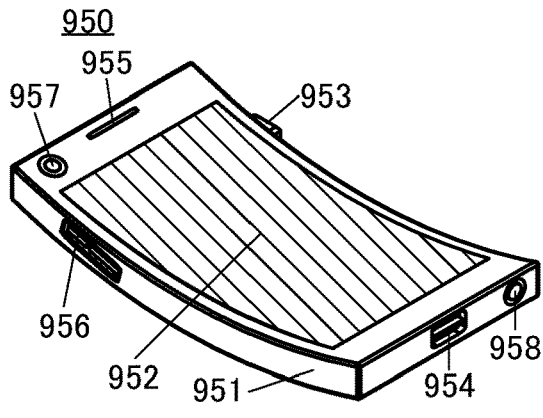

FIG. 21E is an example of a cellular phone 950 that includes a housing 951, a display portion 952, an operation button 953, an external connection port 954, a speaker 955, a jack 956, a camera 957, an earphone jack 958, and the like. In the cellular phone 950, a touch sensor can be provided in the display portion 952. Operations such as making a call and inputting text can be performed by touching the display portion 952 with a finger, a stylus, or the like. In addition, a variety of removal memory devices such as an USB memory and an SSD (solid state drive) in addition to a memory card such as an SD card can be inserted in the jack 956.

In the cellular phone 950, the display device of one embodiment of the present invention can be used for the display portion 952. Thus, a high-quality image can be displayed on the display portion 952.

Figure 21F:
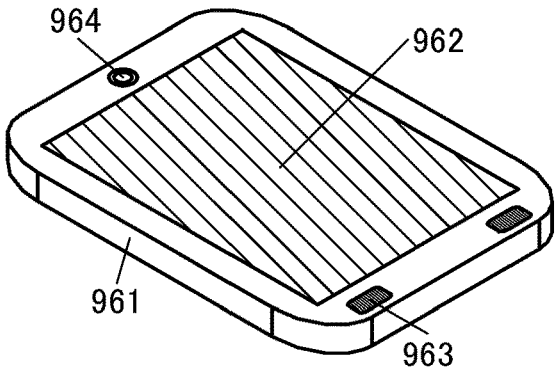

FIG. 21F is an example of a portable data terminal 960 that includes a housing 961, a display portion 962, speakers 963, a camera 964, and the like. A touch panel function that the display portion 962 has enables input and output of information. Furthermore, a character or the like in an image that is captured by the camera 964 can be recognized and the character can be voice-output from the speaker 963.

In the portable data terminal 960, the display device of one embodiment of the present invention can be used for the display portion 962. Thus, a high-quality image can be displayed on the display portion 962.

This embodiment can be implemented in an appropriate combination with the structures described in the other embodiments and the like.

REFERENCE NUMERALS

10: pixel, 11: transistor, 12: transistor, 13: transistor, 14: transistor, 15: transistor, 16: transistor, 20: display element, 21: capacitor, 22: capacitor, 23: capacitor, 31: wiring, 32: wiring, 35: wiring, 36: wiring, 41: wiring, 42: wiring, 45: wiring, 50: wiring, 53: wiring, 54: wiring, 60: display device, 61: display portion, 62: gate driver circuit, 63: data driver circuit, 64: current sensing circuit, 65: correction data generation circuit, 66: memory device, 67: memory device, 215: display portion, 221: gate driver circuit, 231: data driver circuit, 232: data driver circuit, 241: power supply circuit, 723: electrode, 726: insulating layer, 728: insulating layer, 729: insulating layer, 736: coloring layer, 741: insulating layer, 742: semiconductor layer, 744a: electrode, 744b: electrode, 746: electrode, 755: impurity, 771: substrate, 772: insulating layer, 775: n-type semiconductor layer, 777: light-emitting layer, 779: p-type semiconductor layer, 781: semiconductor layer, 782: display element, 783: electrode layer, 785: electrode layer, 787: electrode layer, 789: insulating layer, 791: bump, 793: bump, 795: light-blocking layer, 797: phosphor layer, 810: transistor, 811: transistor, 820: transistor, 821: transistor, 825: transistor, 826: transistor, 842: transistor, 843: transistor, 844: transistor, 845: transistor, 846: transistor, 847: transistor, 910: television device, 911: housing, 912: display portion, 913: speaker, 914: stand, 915: remote controller, 920: information terminal, 921: housing and wristband, 922: display portion, 923: operation button, 924: external connection port, 925: camera, 930: digital camera, 931: finder, 932: housing, 933: display portion, 934: operation button, 935: shutter button, 936: lens, 937: housing, 938: display portion, 940: digital signage, 941: floor, 942: ceiling, 943: pillar, 944: display portion, 950: cellular phone, 951: housing, 952: display portion, 953: operation button, 954: external connection port, 955: speaker, 956: jack, 957: camera, 958: earphone jack, 960: portable data terminal, 961: housing, 962: display portion, 963: speaker, 964: camera, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4030: electrode layer, 4031: electrode layer, 4041: printed board, 4042: integrated circuit, 4102: insulating layer, 4103: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272: FPC, 4273: IC, 4301: coloring layer, 4302: light-blocking layer, 4510: partition wall, 4511: light-emitting layer, 4513: light-emitting element, 4514: filler

The invention claimed is:

1. A method for operating a display device comprising a pixel provided with a first transistor, a second transistor, a display element, and a memory circuit and a correction data generation circuit, wherein one of a source and a drain of the first transistor is electrically connected to one electrode of the display element, wherein one of a source and a drain of the second transistor is electrically connected to the one electrode of the display element, and wherein a gate of the first transistor is electrically connected to the memory circuit, the method comprising:

generating correction data, which is data for correcting a threshold voltage of the first transistor, in the correction data generation circuit in a first period;

writing first data to the memory circuit in a second period;

supplying second data to the memory circuit in a third period to generate third data, which is data in which the second data is added to the first data; and turning off the second transistor to display an image corresponding to the third data by the display element in a fourth period.

2. The method for operating the display device according to claim 1, wherein, in the first period, after the correction data is generated in the correction data generation circuit, a potential corresponding to the correction data is supplied to a back gate of the first transistor.

3. The method for operating the display device according to claim 1, wherein, in the first period, current is fed to the first transistor and the correction data corresponding to the current is generated in the correction data generation circuit.

4. The method for operating the display device according to claim 3, wherein the correction data is generated in the correction data generation circuit such that the current flowing through the first transistor is lower than or equal to a certain value in the first period.

5. The method for operating the display device according to claim 1, wherein no current is fed to the display element in the first period, and wherein current is fed to the display element in the fourth period.

6. A method for operating a display device comprising a pixel provided with a first transistor, a second transistor, a third transistor, a fourth transistor, a capacitor, and a display element and a correction data generation circuit, wherein one of a source and a drain of the first transistor is electrically connected to one electrode of the capacitor, wherein one of a source and a drain of the second transistor is electrically connected to the other electrode of the capacitor, wherein the other electrode of the capacitor is electrically connected to a gate of the third transistor, and wherein one of a source and a drain of the third transistor is electrically connected to one electrode of the display element, wherein one of a source and a drain of the fourth transistor is electrically connected to the one electrode of the display element, the method comprising:

generating correction data, which is data for correcting a threshold voltage of the third transistor, in the correction data generation circuit in a first period;

supplying a first potential to the other electrode of the capacitor in a second period;

supplying a second potential to the one electrode of the capacitor in a third period so that a potential of the other electrode of the capacitor becomes a third potential; and allowing current corresponding to the third potential to flow through the display element by turning off the fourth transistor in a fourth period.

7. The method for operating the display device according to claim 6, wherein, in the first period, after the correction data is generated in the correction data generation circuit, a potential corresponding to the correction data is supplied to a back gate of the third transistor.

8. The method for operating the display device according to claim 6, wherein, in the first period, the fourth transistor is turned on to allow current to flow through the third and fourth transistors and the correction data generation circuit generates the correction data corresponding to the current.

9. The method for operating the display device according to claim 8,
   wherein the correction data is generated in the correction data generation circuit such that the current flowing through the third transistor is lower than or equal to a certain value in the first period.

10. The method for operating the display device according to claim 8,
    wherein the fourth transistor is turned off in the fourth period.

11. The method for operating the display device according to claim 6,
    wherein the second transistor comprises a metal oxide in a channel formation region, and
    wherein the metal oxide comprises In, Zn, and M (M is Al, Ti, Ga, Ge, Sn, Y, Zr, La, Ce, Nd, or Hf).

12. The method for operating the display device according to claim 1,
    wherein the display element is an organic EL element.

13. The method for operating the display device according to claim 6,
    wherein the display element is an organic EL element.

\* \* \* \* \*